(12) United States Patent
Thoman

(10) Patent No.: US 7,280,934 B1
(45) Date of Patent: Oct. 9, 2007

(54) METHOD FOR TEST OF ELECTRONIC COMPONENT

(75) Inventor: Gregory E. Thoman, Loveland, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/409,771

(22) Filed: Apr. 24, 2006

(51) Int. Cl.
*G01P 31/00* (2006.01)
(52) U.S. Cl. .................................... 702/117
(58) Field of Classification Search ................ 702/117, 702/107; 714/816
See application file for complete search history.

(56) References Cited

U.S. PATENT DOCUMENTS 5,586,125 A * 12/1996 Warner ....................... 714/738
6,571,185 B1 * 5/2003 Gauland et al. ............... 702/68
6,865,500 B1 * 3/2005 Variyam et al. ............ 702/117
2003/0225562 A1 * 12/2003 Singh .......................... 703/19

* cited by examiner

*Primary Examiner*—John Barlow
*Assistant Examiner*—Jonathan Moffat

(57) ABSTRACT

A method for testing an electronic component. The method includes connecting the electronic component to a test machine; specifying search range limits, low-to-high transition edge and high-to-low transition edge found criterion, and number of outcomes in a trial including multiple tests specified as proof of low-to-high transition or as high-to-low transition; computing values for initial trial parameters; if low-to-high transition edge not found: executing a low-to-high trial and adjusting trial parameter values based on results of step executing low-to-high trial; if high-to-low transition edge not found: executing high-to-low trial; and if either low-to-high or high-to-low transition edge not found: adjusting trial parameter values based on results of step executing high-to-low trial and repeating above steps beginning with the step having the condition if low-to-high transition edge has not been found.

22 Claims, 15 Drawing Sheets

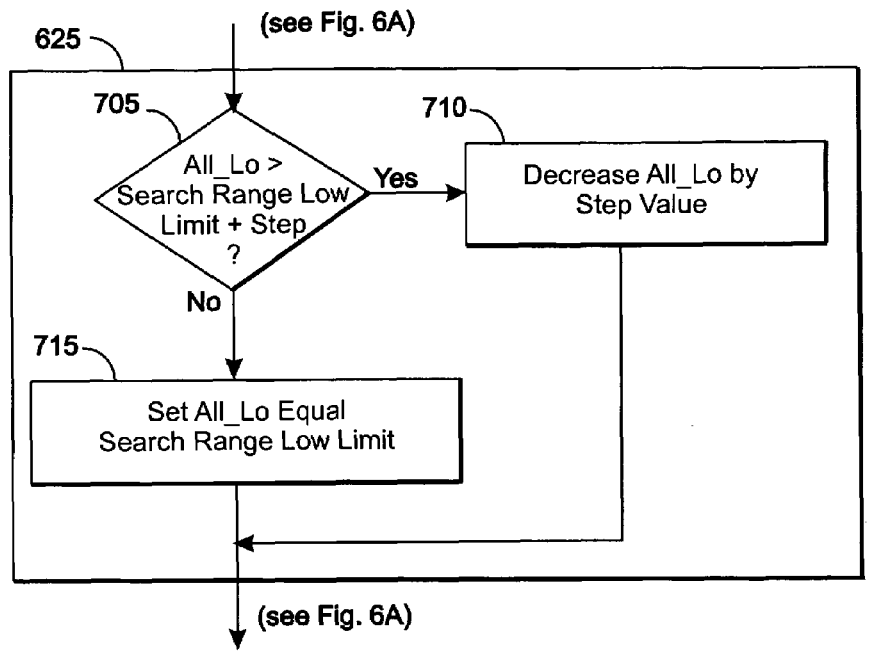
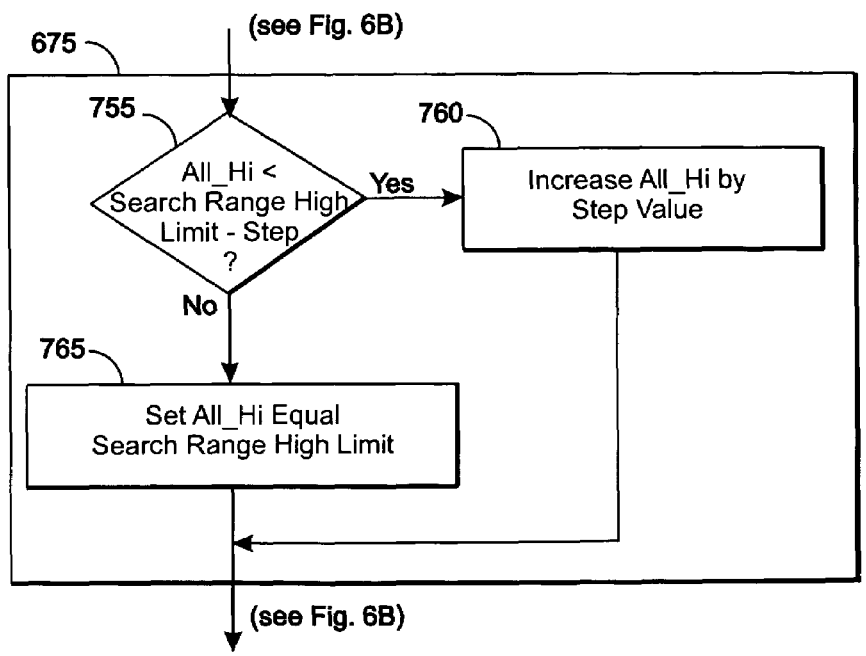

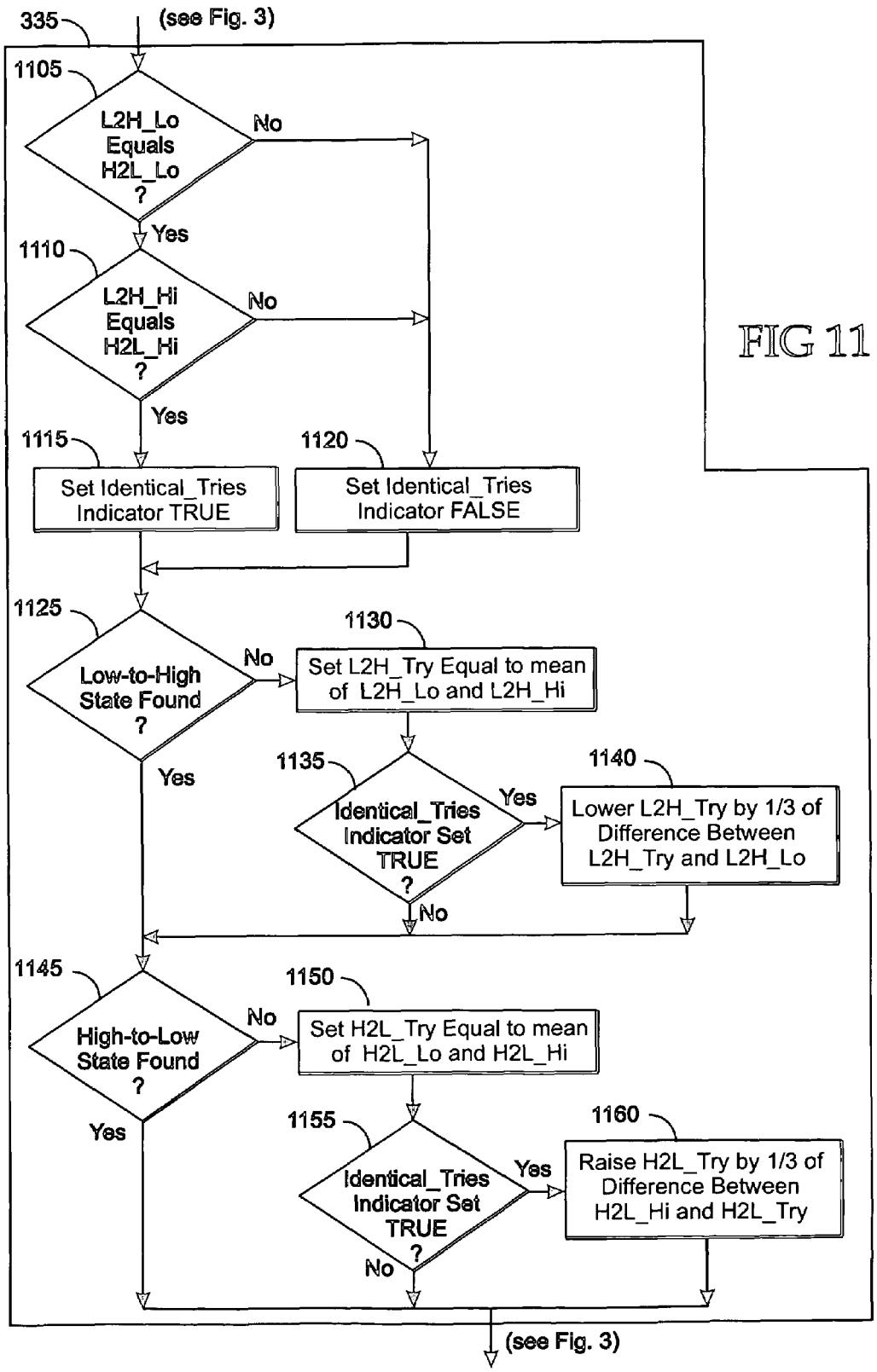

METHOD FOR TEST OF ELECTRONIC COMPONENT

BACKGROUND

Determining the range of signal levels at which an electronic component switches from one state to another in the presence of noise is typically a time consuming task. Current methods for determining this range for electronic components such as comparators often employ pairs of linear searches. One such search begins by running a set of tests at an input signal level for which the results are known to indicate that the component is in a first state for all of the tests of the set and runs successive sets of tests at increased input signal levels until the results indicate that the component is in a second state for a preselected number of the tests in the current set. The other search begins by running a set of tests at an input signal level for which the results are known to indicate that the component is in the second state for all of the tests of the set and runs successive sets of tests at decreased input signal levels until the results indicate that the component is in the first state for a preselected number of the tests in the current set. The searches begin by setting a signal level a short distance away from the expected "comparator trip point" and running a pattern that performs a set of N comparisons in anticipation of obtaining either "all fail" results for one direction of incrimination of the input signal or "all pass" results for the other direction of incrimination of the input signal. If either of these conditions occurs, the signal level is incremented in the appropriate direction and the test pattern is run again for another set of N comparisons. These actions are repeated until one or more of the set of comparisons no longer yields the same result (a "fail" or a "pass") as at the start of the search.

Linear searches are typically time consuming. The speed of the search can be increased by decreasing the span and/or precision of the search. However, if it is preferred to find the comparator trip region over a reasonably wide range so that the set point accuracy can be quantified and if it is preferred to find the bounds of the comparator trip region precisely so that comparison noise can be quantified, a large number of search steps will typically be required. The situation is compounded if the comparator comprises a number of channels rather than just one.

SUMMARY

In a representative embodiment, a method for testing an electronic component is disclosed. The method comprises connecting the electronic component to a test machine; specifying search range limits, low-to-high transition edge and high-to-low transition edge found criterion, and number of outcomes in a trial comprising multiple tests specified as proof of low-to-high transition or as high-to-low transition; computing values for initial trial parameters; if low-to-high transition edge not found: executing a low-to-high trial and adjusting trial parameter values based on results of step executing low-to-high trial; if high-to-low transition edge not found: executing high-to-low trial; and if either low-to-high or high-to-low transition edge not found: adjusting trial parameter values based on results of step executing high-to-low trial and repeating above steps beginning with the step having the condition if low-to-high transition edge has not been found. The trial parameters comprise low-to-high band limits for a low-to-high trial and a low-to-high trial value, high-to-low band limits for a high-to-low trial and a high-to-low trial value, and number of high indicating comparison outcomes, wherein the initial number is for an assumed previous trial.

In another representative embodiment, a computer readable memory device is disclosed. The computer readable memory device embodies a computer program of instructions executable by the computer for testing an electronic component. The instructions comprise connecting the electronic component to a test machine; specifying search range limits, low-to-high transition edge and high-to-low transition edge found criterion, and number of outcomes in a trial comprising multiple tests specified as proof of low-to-high transition or as high-to-low transition; computing values for initial trial parameters; if low-to-high transition edge not found: executing a low-to-high trial and adjusting trial parameter values based on results of step executing low-to-high trial; if high-to-low transition edge not found: executing high-to-low trial; and if either low-to-high or high-to-low transition edge not found: adjusting trial parameter values based on results of step executing high-to-low trial and repeating above steps beginning with the step having the condition if low-to-high transition edge has not been found. The trial parameters comprise low-to-high band limits for a low-to-high trial and a low-to-high trial value, high-to-low band limits for a high-to-low trial and a high-to-low trial value, and number of high indicating comparison outcomes, wherein the initial number is for an assumed previous trial.

In still another representative embodiment, another method for testing an electronic component is disclosed. The method comprises connecting the electronic component to a test machine; specifying search range limits and low-to-high transition edge and high-to-low transition edge found criterion; computing values for initial trial parameters; if low-to-high transition edge not found: ensuring that the electronic component is in its low state, executing a low-to-high trial, and adjusting trial parameter values based on results of step executing low-to-high trial; if high-to-low transition edge not found: ensuring that the electronic component is in its high state and executing high-to-low trial; and if either low-to-high or high-to-low transition edge not found: adjusting trial parameter values based on results of step executing high-to-low trial and repeating above steps beginning with the step having the condition if low-to-high transition edge has not been found. The trial parameters comprise low-to-high band limits for a low-to-high trial and a low-to-high trial value and high-to-low band limits for a high-to-low trial and a high-to-low trial value.

In yet another representative embodiment, a computer readable memory device is disclosed. The computer readable memory device embodies a computer program of instructions executable by the computer for testing an electronic component. The instructions comprise connecting the electronic component to a test machine; specifying search range limits and low-to-high transition edge and high-to-low transition edge found criterion; computing values for initial trial parameters; if low-to-high transition edge not found: ensuring that the electronic component is in its low state, executing a low-to-high trial, and adjusting trial parameter values based on results of step executing low-to-high trial; if high-to-low transition edge not found: ensuring that the electronic component is in its high state and executing high-to-low trial; and if either low-to-high or high-to-low transition edge not found: adjusting trial parameter values based on results of step executing high-to-low trial and repeating above steps beginning with the step having the condition if low-to-high transition edge has not been found. The trial parameters comprise low-to-high band limits for a low-to-high trial and a low-to-high trial value and high-to-low band limits for a high-to-low trial and a high-to-low trial value.

Other aspects and advantages of the representative embodiments presented herein will become apparent from the following detailed description, taken in conjunction with the accompanying drawings.

BRIEF DESCRIPTION OF THE DRAWINGS

The accompanying drawings provide visual representations which will be used to more fully describe various representative embodiments and can be used by those skilled in the art to better understand them and their inherent advantages. In these drawings, like reference numerals identify corresponding elements.

FIG. 7A is a drawing of an expansion of a block of the flow chart of FIG. 6A.

FIG. 7B is a drawing of an expansion of a block of the flow chart of FIG. 6B.

FIG. 11 is a drawing of an expansion of still another block of the flow chart of FIG. 3.

DETAILED DESCRIPTION

Figure 1:
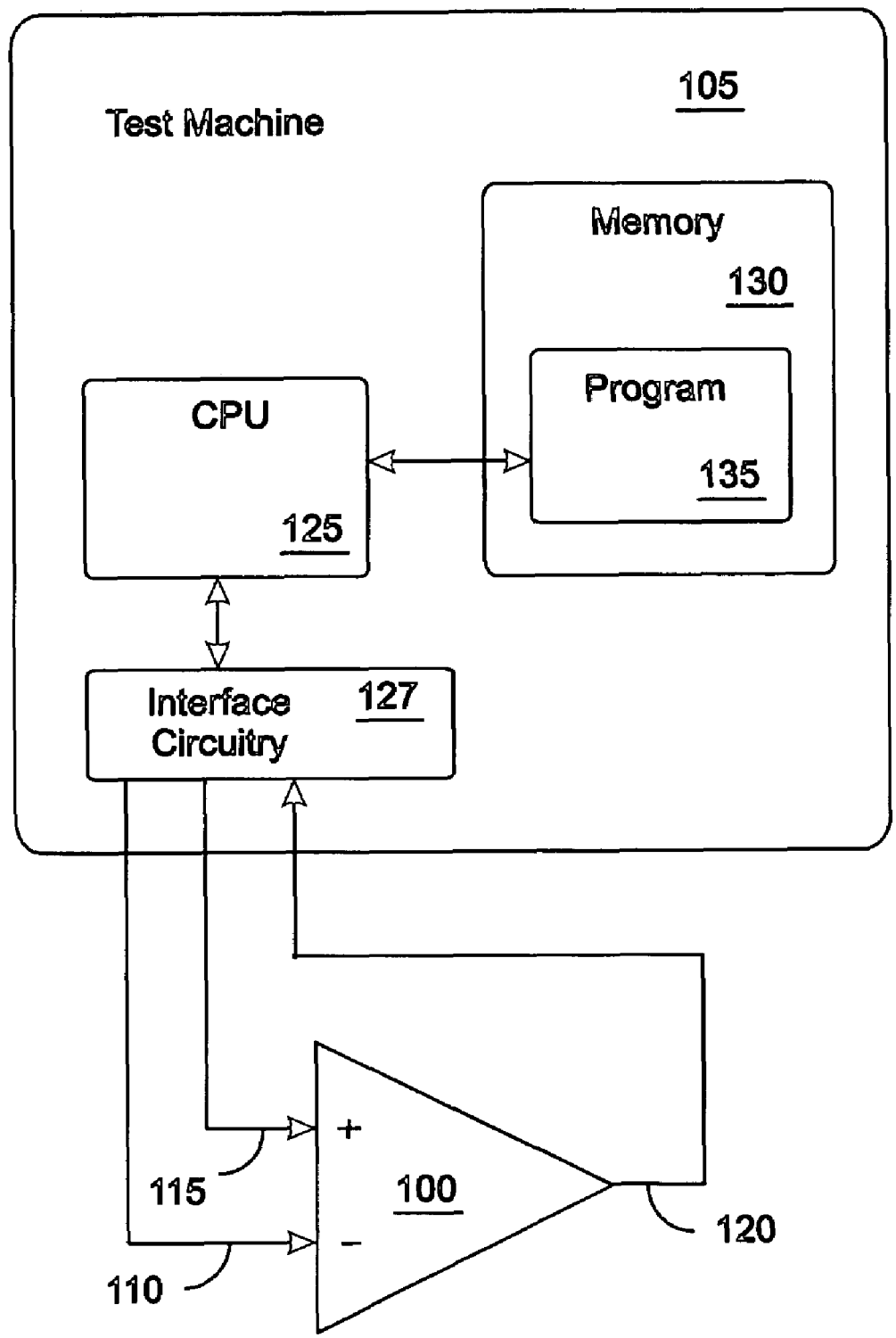
FIG. 1 is a block diagram of an electronic component attached to a test machine as described in various representative embodiments.

As shown in the drawings for purposes of illustration, novel techniques are disclosed herein for determining the range of signal levels at which an electronic component such as a comparator switches from one state to another in the presence of noise and/or hysteresis. These techniques comprise a double-ended binary search for the upper and lower limits of this range of signal levels. The present search techniques are typically faster than previous techniques which most often include a pair of linear searches.

In the following detailed description and in the several figures of the drawings, like elements are identified with like reference numerals.

FIG. 1 is a block diagram of an electronic component 100 attached to a test machine 105 as described in various representative embodiments. In FIG. 1, the electronic component 100 has a first input 110, also referred to herein as a reference input 110, a second input 115, also referred to herein as a signal input 115, and an output 120. The choice of reference input 110 and signal input 115 is arbitrary and may be reversed. The test machine 105 comprises a central processing unit (CPU) 125, interface circuitry 127 and a memory 130. A software program 135, also referred to herein as a program 135, is stored in the test machine 105 and is used for testing the electronic component 100. The electronic component 100 is also referred to herein as component 100 and may be comparator 100. The assignment of the reference input 110 to the negative polarity and the signal input 115 to the positive polarity is arbitrary and may be reversed. The reference input 110 may be attached to ground or any other appropriate reference potential.

When a test is performed on the component 100, the software program 135 is loaded into the central processing unit 125 from the memory 230 and executed. Commands generated from the software program 135 are transmitted to the interface circuitry 127 which applies the appropriate stimuli to the inputs 110,115 of the electronic component 100. The condition of the output 120 is then returned to the interface circuitry 127 and subsequently to the executing software program 135.

As used herein, the component 100 is an electronic or other component 100 having two output states, a first state and a second state, as detected at the output 120. The first state is referred to herein as the low state and would typically indicate that the output of the component is either a low voltage or low current. The second state is referred to herein as the high state and would typically indicate that the output of the component is either a high voltage or high current.

Figure 2A:
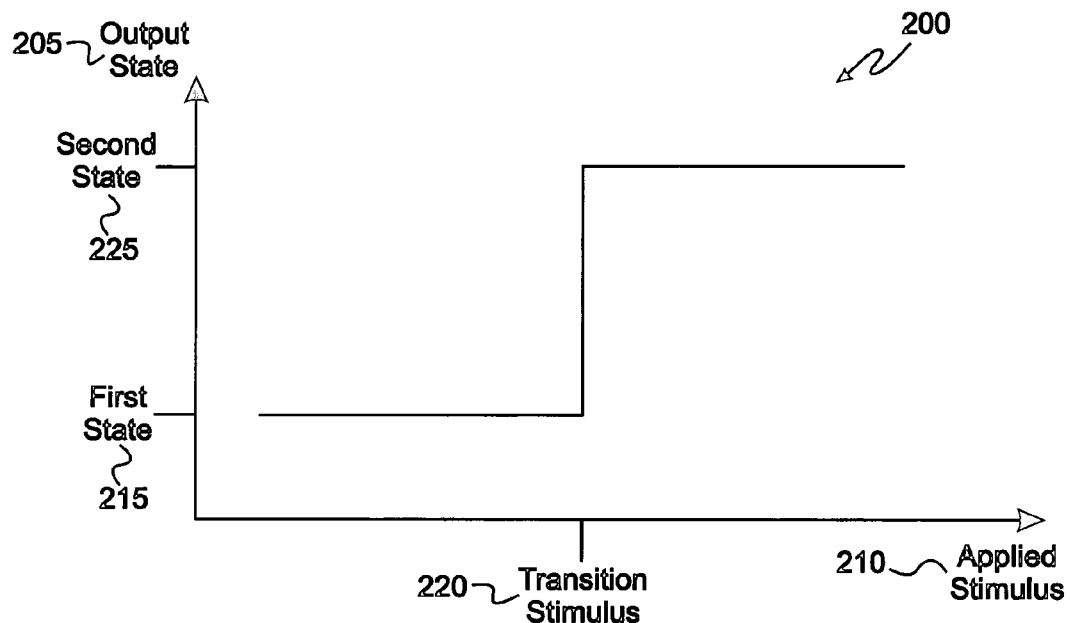
FIG. 2A is a drawing of a graph of the output state of the component vs. applied stimulus in the absence of hysteresis and noise.

FIG. 2A is a drawing of a graph 200 of the output state 205 of the component 100 vs. applied stimulus 210 in the absence of hysteresis and noise. In the example of FIG. 2A the output of component 100 is in a first state 215, also referred to herein as a low state 215, at any applied stimulus 210 to the left of or less than the transition stimulus 220. In contrast, the output of component 100 is in a second state 225, also referred to herein as a high state 225, at any applied stimulus 210 to the right of or greater than the transition stimulus 220.

Figure 2B:
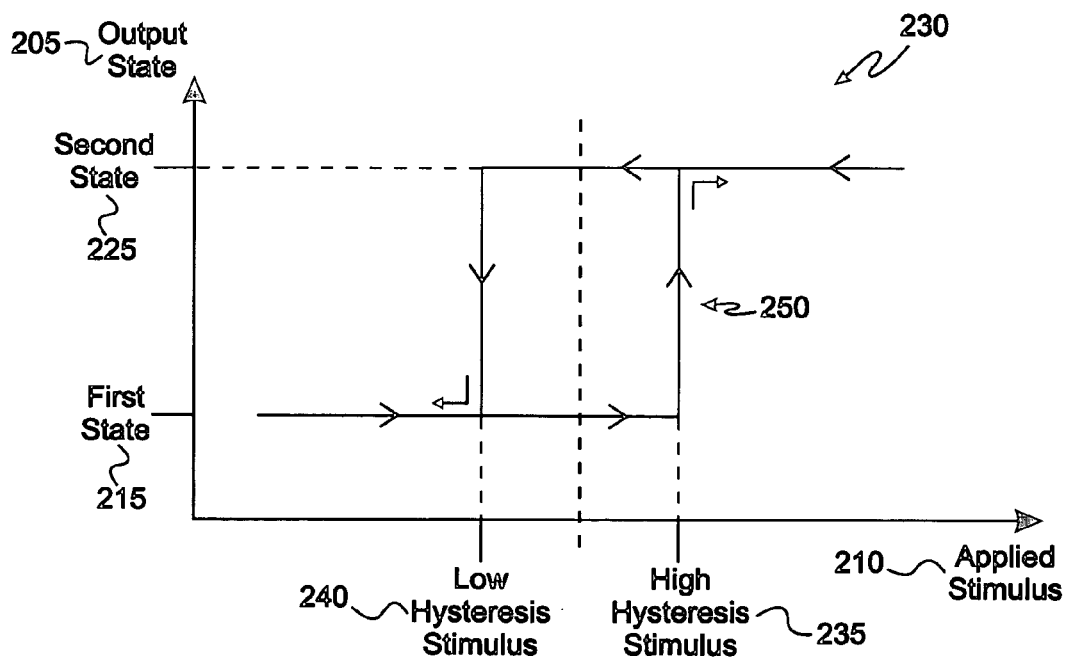
FIG. 2B is a drawing of another graph of the output state of the component vs. applied stimulus in the presence of hysteresis and the absence of noise.

FIG. 2B is a drawing of another graph 230 of the output state 205 of the component 100 vs. applied stimulus 210 in the presence of hysteresis 250 and the absence of noise. In the example of FIG. 2B when transitioning from a low applied stimulus 210 to a high applied stimulus 210, the output of component 100 is in a first state 215 until the applied stimulus 210 reaches the value of the high hysteresis stimulus 235, at which value the output of component 100 transitions to the second state 225. In contrast, when transitioning from a high applied stimulus 210 to a low applied stimulus 210, the output of component 100 is in the second state 215 until the applied stimulus 210 reaches the value of the low hysteresis stimulus 240, at which value the output of component 100 transitions to the first state 215.

Figure 2C:
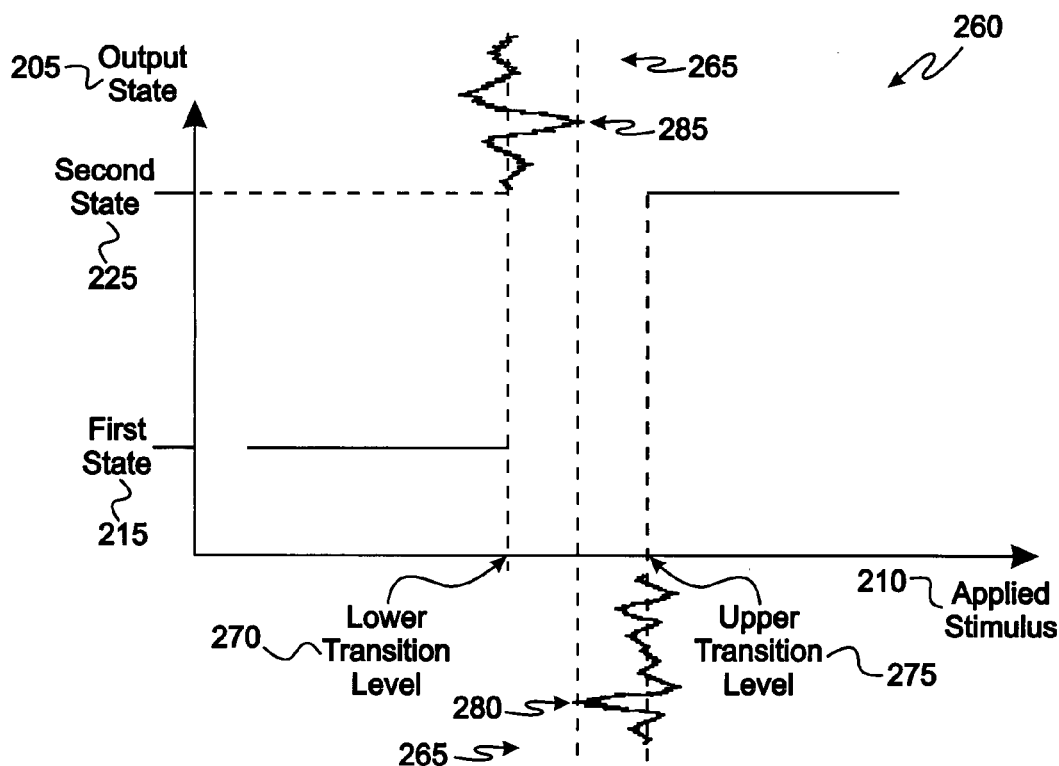
FIG. 2C is a drawing of still another graph of the output state of the component vs. applied stimulus in the absence of hysteresis and in the presence of noise as described in various representative embodiments.

FIG. 2C is a drawing of still another graph 260 of the output state 205 of the component 100 vs. applied stimulus 210 in the absence of hysteresis 250 and in the presence of noise as described in various representative embodiments. In the representative embodiment of FIG. 2C, noise 265 is shown superimposed on the applied stimulus 210 at lower transition level 270 and superimposed on the applied stimulus 210 at higher transition level 275. Note that the superposition of the noise 265 at lower point 280 will cause the output state 205 of the component 100 to be in its low state 215, whereas the other stimuli 210 in the superposition will cause the output state 205 of the component 100 to be in its high state 225, and that the superposition of the noise 265 at higher point 285 will cause the output state 205 of the component 100 to be in its high state 225, whereas the other stimuli 210 in the superposition will cause the output state 205 of the component 100 to be in its low state 215.

The lower transition level 270 and the higher transition level 275 or another pair of levels between those values are determined by successively applying stimulus 210 to the component 100 in sets of tests wherein each set of tests comprises "N" tests at a given stimulus 210, wherein the applied stimulus 210 is dependent upon the particular set of tests being run. In this process and as used herein, the lower transition level 270 is the applied stimulus 210 at which all but one of the "N" tests in one of the sets of tests indicates the output state 205 of the component 100 to be in its low state 215 and in this process and as used herein, the higher transition level 275 is the applied stimulus 210 at which all but one of the "N" tests in another set of the sets of tests indicates the output state 205 of the component 100 to be in its high state 225.

Figure 2D:
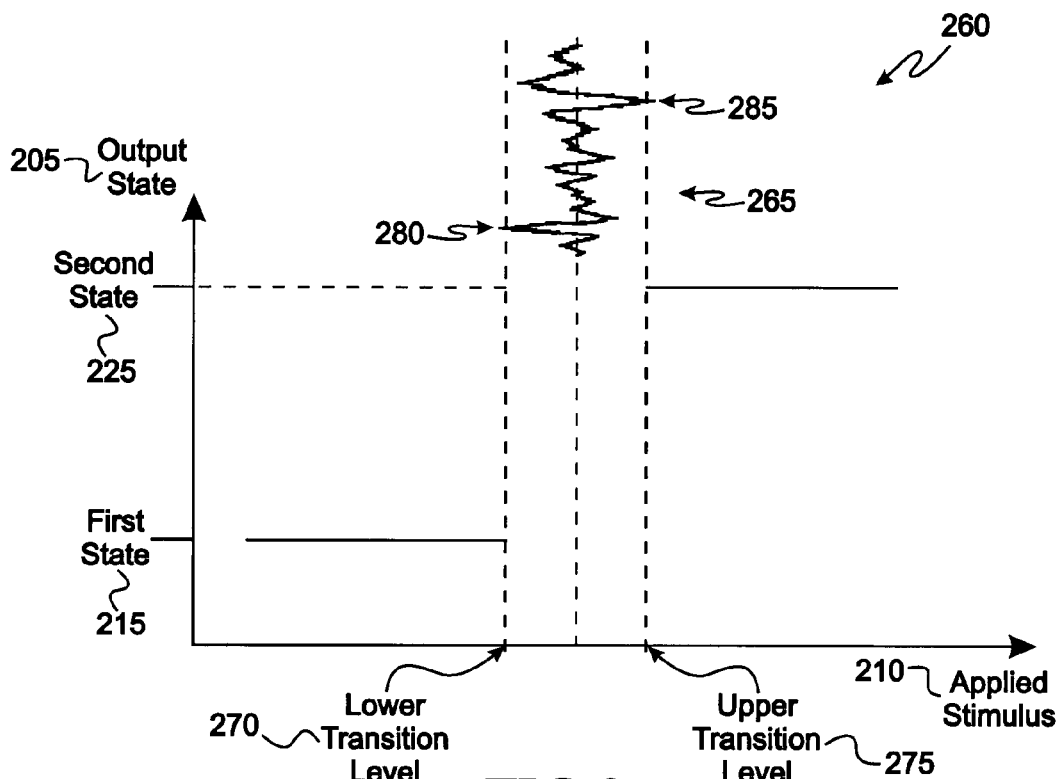
FIG. 2D is a drawing of yet another graph of the output state of the component vs. applied stimulus in the absence of hysteresis and in the presence of noise as described in various representative embodiments.

FIG. 2D is a drawing of yet another graph 260 of the output state 205 of the component 100 vs. applied stimulus 210 in the absence of hysteresis 250 and in the presence of noise as described in various representative embodiments. In the representative embodiment of FIG. 2D, noise 265 is shown superimposed on the (nominal) transition stimulus value 220. Note that the superposition of the noise 265 at lower point 280 and at other points of the superposition less than the (nominal) transition stimulus value 220 will cause the output state 205 of the component 100 to be in its low state 215, whereas and that the superposition of the noise 265 at higher point 285 and at other points of the superposition greater than the (nominal) transition stimulus value 220 will cause the output state 205 of the component 100 to be in its high state 225.

The method disclosed herein allows the user to set a transition threshold which is the number of changed comparison outcomes in a set of tests specified by the user to be proof of a transition. Referring to FIGS. 2C and 2D, the user can seek the lower transition level and upper transition level by using the method disclosed herein with the transition threshold set to either 1 (FIG. 2D) or to N−1 (FIG. 2C). The user can also set the transition threshold to any value between 1 and N−1 to find a pair of stimulus levels between the upper transition level and lower transition level that the user deems to be statistically significant representations of transitions or that are otherwise of interest to the user.

In addition to the search results just discussed, the method disclosed herein will provide two values, All_Lo and All_Hi, which lie just below the lower transition level 270 and just above the upper transition level 275 respectively. These provide the user with additional information about the transition region, especially when the transition threshold is set to some value between 1 and N-1.

In the absence of noise but in the presence of hysteresis 250, the low hysteresis stimulus 240 and the high hysteresis stimulus 235 of FIG. 2B would correspond respectively to the lower transition level 270 and the higher transition level 275 of FIGS. 2C and 2D.

The characteristics and discussions related to FIGS. 2B and 2C (or FIGS. 2B and 2D) can be combined for the case of the presence of hysteresis 250 and the presence of noise 265.

Figure 3:
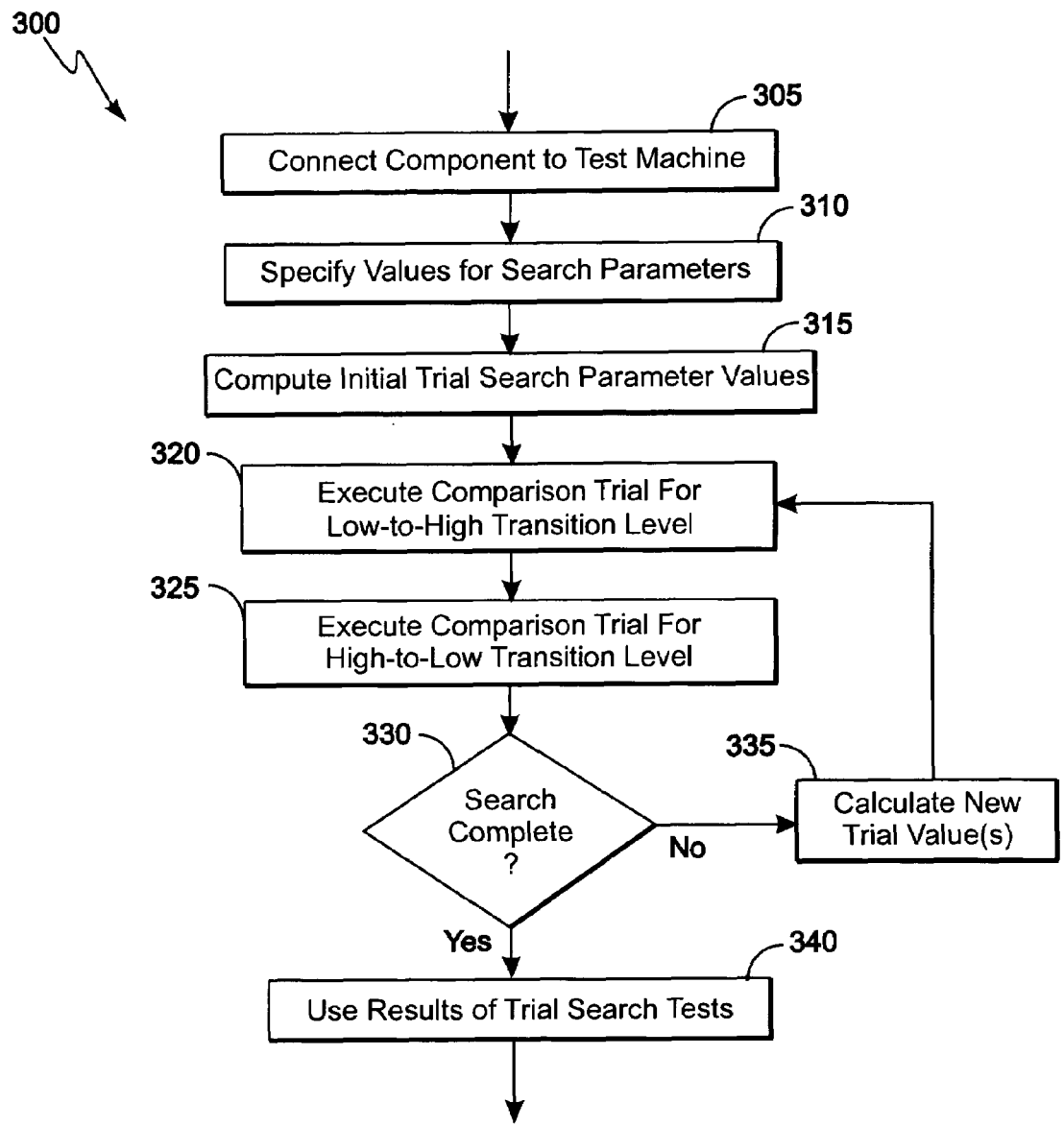
FIG. 3 is a drawing of a flow chart of a method for obtaining lower and upper transition level information as described in various representative embodiments.

FIG. 3 is a drawing of a flow chart of a method 300 for obtaining lower and upper transition level information as described in various representative embodiments. In the method 300 of FIG. 3, values can be obtained for a low-to-high transition edge and a high-to-low transition edge which can represent the lower and higher transition levels 270,275 or can represent values between the lower and higher transition levels 270,275 as selected by the user. The flow chart of FIG. 3 is an overview of this process. Flow charts of the details of various blocks of FIG. 3 will be described in subsequent figures.

As used in the following, the term trial refers to a set of tests; a low-to-high trial is a set of tests in which an input is first applied to the component 100 to place its output 120 in the low state 215 and then the input is changed to the low-to-high trial value (L2H_Try); the low-to-high transition edge is the input applied to the component 100 which will result in the number of changed comparison outcomes specified by the user to be proof of a transition when a low-to-high trial is performed; a high-to-low trial is a set of tests in which an input is first applied to the component 100 to place its output 120 in the high state 225 and then the input is changed to the high-to-low trial value (H2L_Try); and the high-to-low transition edge is the input applied to the component 100 which will result in the number of changed comparison outcomes specified by the user to be proof of a transition when a high-to-low trial is performed. When the number of changed comparison outcomes specified to be proof of a transition is set to one, the low-to-high transition edge will represent the lower transition level 270 and the high-to-low transition edge will represent the higher transition level 275. When the number of changed comparison outcomes specified to be proof of a transition is set to one less than the number of comparisons in a set of comparisons (or equal to the number of comparisons in a set), the low-to-high transition edge will represent the higher transition level 275 and the high-to-low transition edge will represent the lower transition level 270. Other settings of the number of changed comparison outcomes specified to be proof of a transition can be used to obtain intermediate values between the lower and higher transition levels 270, 275. The low-to-high transition edge and the high-to-low transition edge are two of the end results of the process of FIG. 3.

In searching for the transition signal level for a comparator 100 in the presence of noise and/or hysteresis, there is not one answer as to where the transition occurs, but rather there is a band of behavior that characterizes the comparator transition. An objective of the following is to locate the upper and lower limits of that band or a pair of intermediate points of interest within that band. As such, there are 2 searches that have to be conducted to find those 2 points. These two searches will be conducted in combination by performing alternating trials rather than performing one search to completion to find one point and then performing the other search to completion to find the other point. Whenever the results of any one of those trials affect the parameters for any subsequent trial whether for the low-to-high transition edge or the high-to-low transition edge, any affected search parameters will be updated. In the early stages of the search, typically the parameters governing the selection of trial values for both the low-to-high transition edge and the high-to-low transition edge will be dependent upon the results of each trial. In other words, after a single set of comparisons is run two sets of search parameters will be updated. Near the end of the process, however, the results for a set of comparisons of the high-to-low search will only affect the high-to-low search parameters, and the results for a set of comparisons of the low-to-high search will only affect the low-to-high search parameters. So, the searches become independent near their ends as the remaining search ranges of the two searches cease to overlap.

Decisions are made based on the number of comparisons that yield a transition and the number that do not. As an example, if a set of high-to-low comparisons reads all low, the low-to-high search will be updated to bring the lower end of the low-to-high search range up equal to the value that was just tried, and the high-to-low search will be updated to bring the high-to-low lower value up equal to the value that was just tried. Then the low-to-high search is performed using a previously computed trial signal level. And, if the results of the low-to-high trial are all high, the upper limit of the high-to-low search will be updated to the trial value for the low-to-high search, and the upper limit of the low-to-high search will be updated to the trial value for the low-to-high search.

In block 305, the electronic component 100 is attached to the test machine 105 as for example in FIG. 1. Block 305 then transfers control to block 310.

In block 310, values for various search parameters which are fixed for the determinations of FIG. 3 are specified by the user. These parameters include the following:

(1) The lower limit of the search range of the sets of tests to be performed LoLim, (2) The upper limit of the search range of the sets of tests to be performed HiLim, (3) The minimum search step which is the resolution limit of the process Step, (4) The number of comparisons N to be made for each set of tests also referred to herein as the number of comparisons per set of tests, and (5) The transition Threshold which is the number of comparison outcomes in a set of tests specified by the user to be proof of a transition.

The number of "high" comparison outcomes in any given trial whether a low-to-high trial or a high-to-low trial is identified by the symbol "HiCnt", and the number of "low" comparison outcomes in any given trial whether a low-to-high trial or a high-to-low trial is identified by the symbol "LoCnt". Block 310 then transfers control to block 315.

In block 315, values for the initial search parameters are computed. These search parameter values are adjustable during the process and comprise values for the following:

(1) The all low state bias value All_Lo. The all low state bias value All_Lo is a value of applied stimulus 210 adjusted such that the initial state for a low-to-high trial is the low state 215. The all low state bias value All_Lo is initially set equal to the lower limit of the search range of the sets of tests to be performed LoLim.

(2) The all high state bias value All_Hi. The all high state bias value All_Hi is a value of applied stimulus 210 adjusted such that the initial state for all a high-to-low trial is the high state 225. The all high state bias value All_Hi is initially set equal to the upper limit of the search range of the sets of tests to be performed HiLim.

(3) The low-to-high lower limit L2H_Lo. The low-to-high lower limit L2H_Lo is the lower limit of the low-to-high band used to search for the transition edge for low-to-high transitions. The low-to-high lower limit L2H_Lo is one of the values used to compute a new trial value for a low-to-high trial. The low-to-high lower limit L2H_Lo is initially set equal to the lower limit of the search range of the sets of tests to be performed LoLim.

(4) The low-to-high upper limit L2H_Hi. The low-to-high upper limit L2H_Hi is the upper limit of the low-to-high band used to search for the transition edge for low-to-high transitions. The low-to-high upper limit L2H_Hi is one of the values used to compute a new trial value for a low-to-high trial. The low-to-high upper limit L2H_Hi is initially set equal to the upper limit of the search range of the sets of tests to be performed HiLim. The low-to-high lower limit L2H_Lo and the low-to-high upper limit L2H_Hi are collectively referred to as the low-to-high band limits L2H_Lo, L2H_Hi.

(5) The high-to-low lower limit H2L_Lo. The high-to-low lower limit H2L_Lo is the lower limit of the high-to-low band used to search for the transition edge for high-to-low transitions. The high-to-low lower limit H2L_Lo is one of the values used to compute a new trial value for a high-to-low trial. The high-to-low lower limit H2L_Lo is initially set equal to the lower limit of the search range of the sets of tests to be performed LoLim.

(6) The high-to-low upper limit H2L_Hi. The high-to-low upper limit H2L_Hi is the upper limit of the high-to-low band used to search for the transition edge for high-to-low transitions. The high-to-low upper limit H2L_Hi is one of the values used to compute a new trial value for a high-to-low trial. The high-to-low upper limit H2L_Hi is initially set equal to the upper limit of the search range of the sets of tests to be performed HiLim. The high-to-low lower limit H2L_Lo and the high-to-low upper limit H2L_Hi are collectively referred to as the high-to-low band limits H2L_Lo, H2L_Hi.

(7) The low-to-high trial value L2H_Try. The low-to-high trial value L2H_Try is the applied stimulus 210 to which the input of the component 100 is changed when executing a low-to-high trial. The low-to-high trial value L2H_Try is initially set equal to a value between the lower limit of the search range of the sets of tests to be performed LoLim and the upper limit of the search range of the sets of tests to be performed HiLim. A good choice for the initial low-to-high trial value L2H_Try is [LoLim+(1/3)*(HiLim−LoLim)].

(8) The high-to-low trial value H2L_Try. The high-to-low trial value H2L_Try is the applied stimulus 210 to which the input of the component 100 is changed when executing a high-to-low trial. The high-to-low trial value H2L_Try is initially set equal to a value between the lower limit of the search range of the sets of tests to be performed LoLim and the upper limit of the search range of the sets of tests to be performed HiLim. A good choice for the initial high-to-low trial value H2L_Try is [HiLim−(1/3)*(HiLim−LoLim)]. These choices for the initial low-to-high trial value L2H_Try and the initial high-to-low trial value H2L_Try split the band between the lower limit of the search range of the sets of tests to be performed LoLim and the upper limit of the range of the sets of tests to be performed HiLim into three equal increments.

(9) The number of comparison outcomes indicating "high" HiCnt. At this point, the number of comparison outcomes indicating "high" HiCnt is that number from an "assumed" previous trial. The number of comparison outcomes indicating "high" HiCnt is initially set equal to any positive integer, for example the number one.

Various appropriate software program 135 control flags can also be set/cleared as needed at this point in the process. For example, a low-to-high "found" flag and a high-to-low "found" flag can be cleared. A criterion that can be used for finding the low-to-high transition edge and that can be used for finding the high-to-low transition edge depends upon the value specified for the minimum search step. In particular, the low-to-high transition edge could be considered found if the absolute difference between upper and lower low-to-high band limits L2H_Hi, L2H_Lo for the low-to-high trial is less than the minimum search step and the high-to-low transition edge could be considered found if the absolute difference between upper and lower high-to-low band limits H2L_Hi, H2L_Lo for the high-to-low trial is less than the minimum search step. Block 315 then transfers control to block 320.

In block 320, a comparison trial for the low-to-high transition edge is executed. The details of this trial are described more fully in the description associated with FIG. 4A and related figures. Block 320 then transfers control to block 325.

In block 325, a comparison trial for the high-to-low transition edge is executed. The details of this trial are described more fully in the description associated with FIG. 4B and related figures. Block 325 then transfers control to block 330.

The order of the low-to-high trial of block 320 and the high-to-low trial of block 325 is arbitrary and may be reversed. One data update operation, updating of the "other" trial value if invalidated by the first trial's results, must remain with the first of the two trials, and setting of LoCnt to a nonzero value in block 315 is needed it the high-to-low trial is first.

In block 330, if values for both the low-to-high transition edge and the high-to-low transition edge have been found the search is complete and block 330 transfers control to block 340. Otherwise, block 330 transfers control to block 335. The low-to-high transition edge is the L2H_Try after which the difference between the low-to-high upper limit L2H_Hi and the low-to-high lower limit L2H_Lo becomes less than or equal to the minimum search Step, i.e., (L2H_Hi−L2H_Lo)<=Step. The high-to-low transition edge is the H2L_Try after which the difference between the high-to-low upper limit H2L_Hi and the high-to-low lower limit H2L_Lo becomes less than or equal to the minimum search Step, i.e., (H2L_Hi-H2L_Lo)<=Step. Appropriate flags can be set in block 330 to indicate whether or not the low-to-high transition edge and/or the high-to-low transition edge have been found. Such flags can be useful in controlling the operation of the method.

In block 335, new trial value(s) are computed as appropriate. The details of these computations for the new trial value(s) are described more fully in the description associated with FIG. 11. Block 335 then transfers control to block 320.

In block 340, the results of the above process are used. Such use could include a comparison of the resultant low-to-high transition edge and the resultant high-to-low transition edge to the specifications for the type of component 100 tested and discarding the component 100 if the low-to-high transition edge or the high-to-low transition edge lies outside the limits of the specifications. Such use could also include statistically analyzing the resultant low-to-high transition edge and the resultant high-to-low transition edge making appropriate process changes to hopefully increase the fabrication yield of the component 100. Block 340 then terminates the process.

Figure 4A:
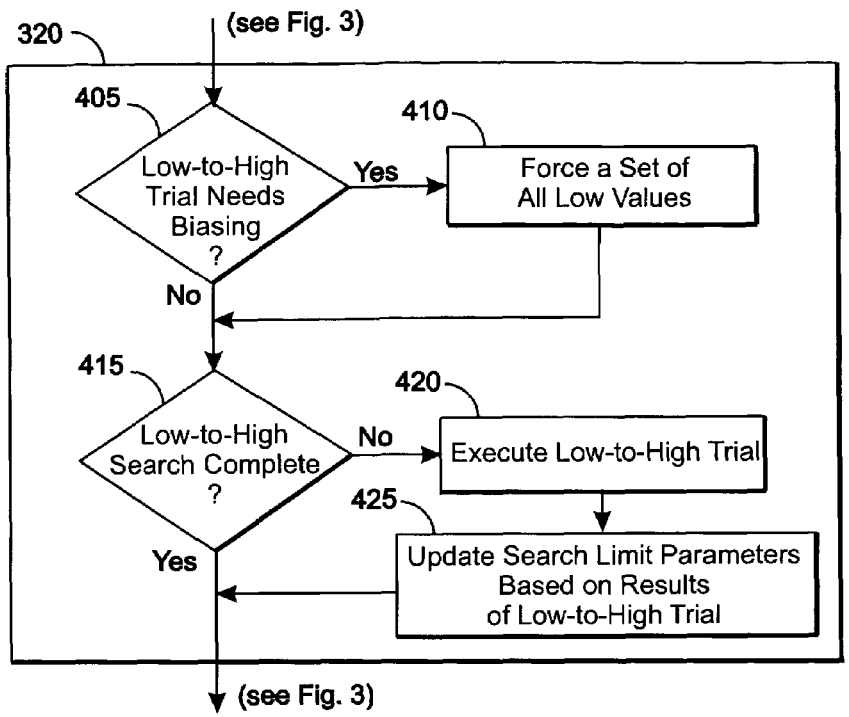
FIG. 4A is a drawing of an expansion of a block of the flow chart of FIG. 3.

FIG. 4A is a drawing of an expansion of a block of the flow chart of FIG. 3. In FIG. 4A, the expanded block is block 320 which is the step executing a trial for low-to-high transition edge. Block 320 accepts control from block 315 of FIG. 3 and passes control to block 405 in FIG. 4A.

Figure 5A:
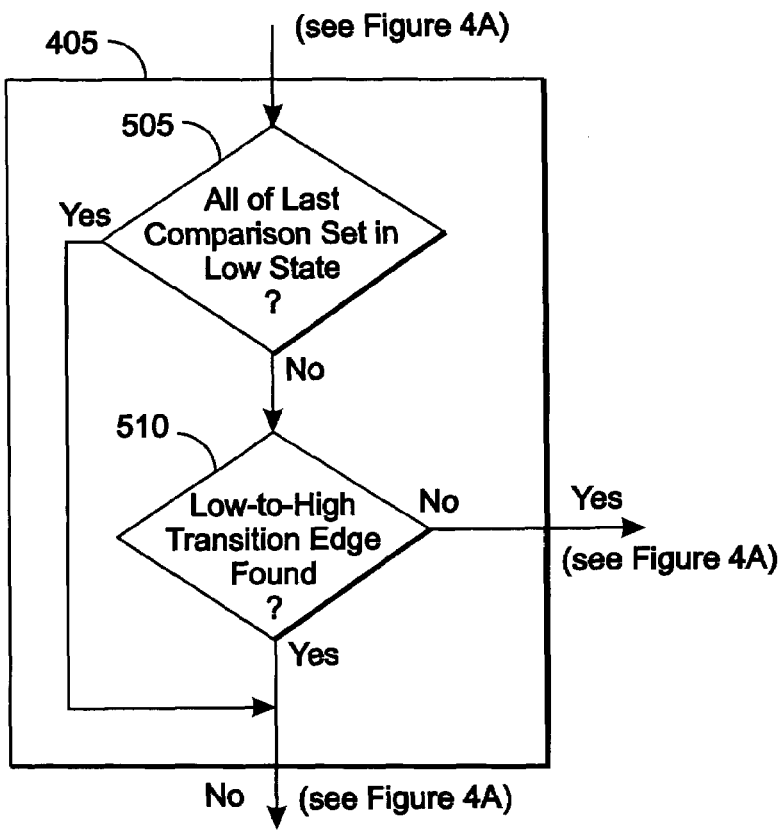
FIG. 5A is a drawing of an expansion of a block of the flow chart of FIG. 4A.

In block 405, if a component bias will be needed at the signal input 115 to obtain initial all low output indications for starting the low-to-high trial, block 405 transfers control to block 410. The details of block 405 are shown in FIG. 5A. Otherwise block 405 transfers control to block 415. Block 405 with its details in FIG. 5A is present to compensate for the presence of hysteresis. In such a situation, it is first necessary to ensure, by force if necessary, that the electronic component 100 is in the low state 215 which is accomplished by the application of an appropriate bias. The effect of this bias is checked and, if necessary, the bias value adjusted at each occurrence of block 320 due to the fact that random fluctuations or drift in the system may result in a bias that is no longer of an appropriate level.

Figure 6A:
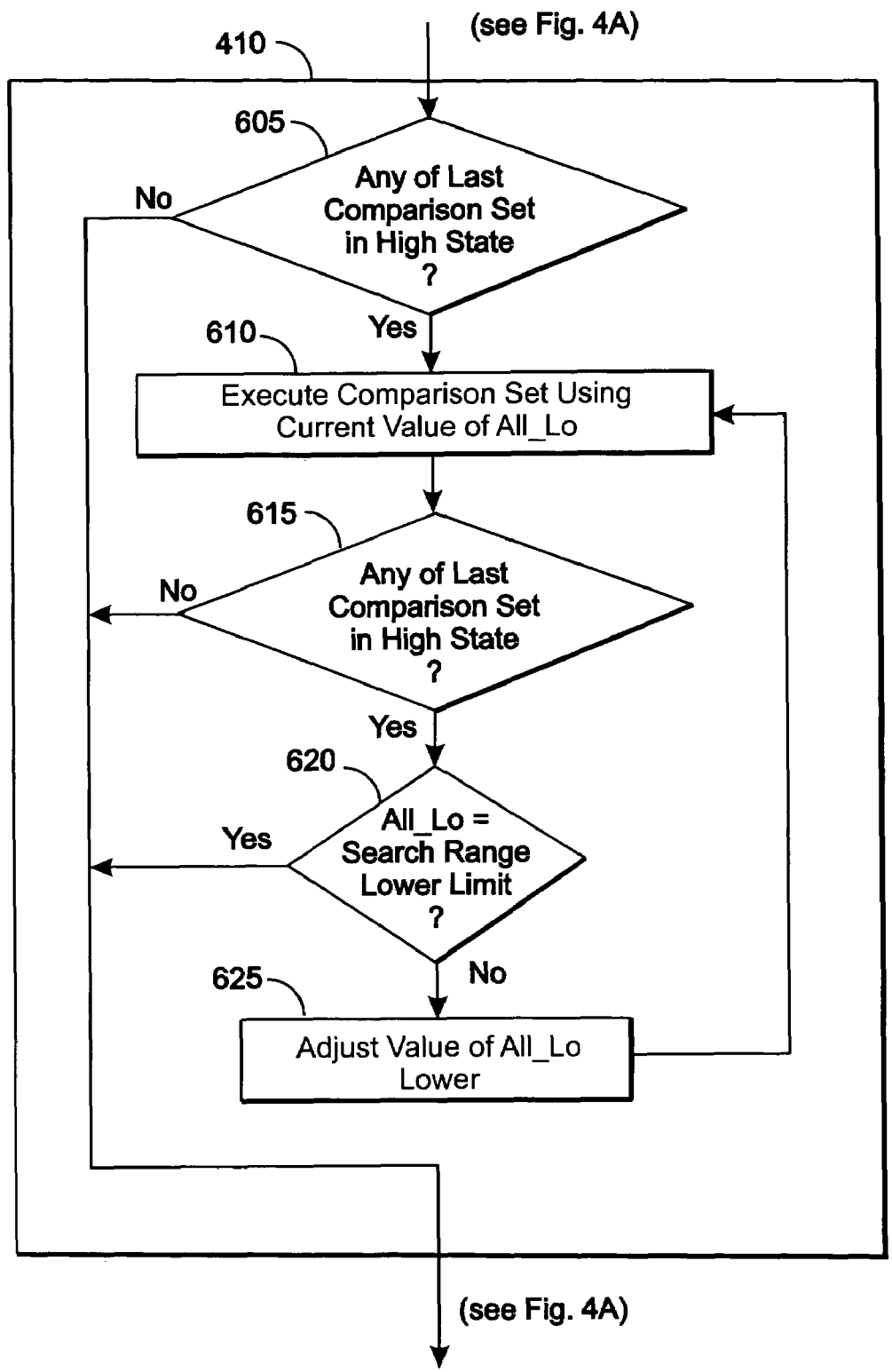
FIG. 6A is a drawing of still another expansion of a block of the flow chart of FIG. 4A.

In block 410, a component bias is applied to the signal input 115 to obtain initial all low comparison results for starting the low-to-high trial. The details of block 410 are shown in FIG. 6A. Block 410 then transfers control to block 415.

In block 415, if the low-to-high search is complete block 415 exits block 320 transferring control to block 325. Otherwise, block 415 transfers control to block 420.

In block 420, the low-to-high trial is executed. In executing the low-to-high trial, the numbers of comparison results indicating high and low (respectively HiCnt and LoCnt) are set equal to zero. Then the value of the signal input 115 is set to the low-to-high trial value (L2H_Try) and a set of comparisons is performed by making separate observations of the value of the output 120 of the component 100. With each comparison (observation), if the output 120 of the component 100 is in the high state 225, then the number of results indicating high (HiCnt) is incremented by one, while if the output 120 of the component 100 is in the low state 225, then the number of results indicating low (LoCnt) is incremented by one. Block 420 then transfers control to block 425.

In block 425, the search limit parameters are updated per the results of the low-to-high trial of block 420. The details of this update of the search limit parameter(s) are described more fully in the description associated with FIG. 8A. Block 425 then exits block 320 transferring control to block 325.

Figure 4B:
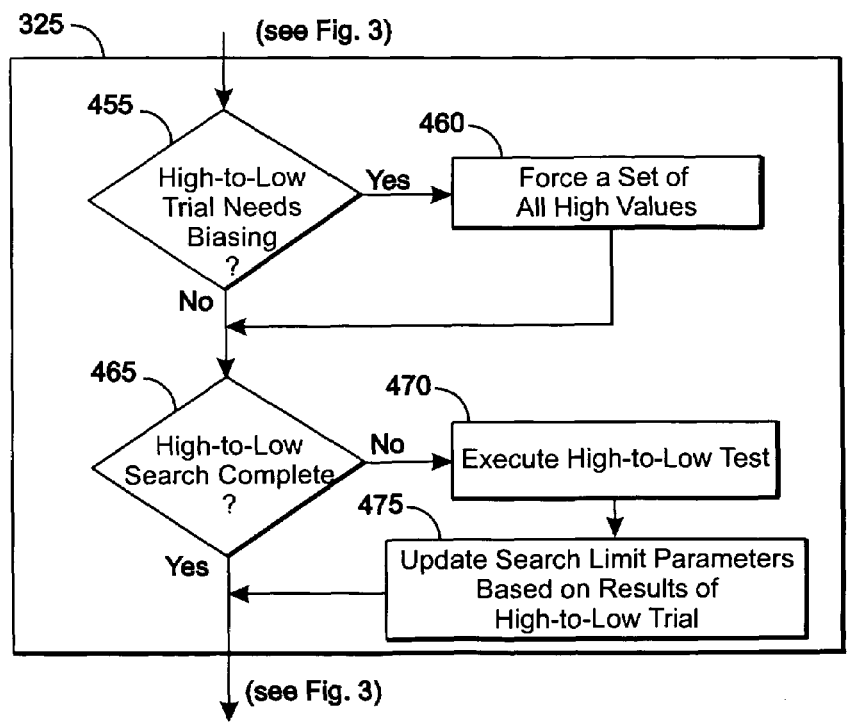
FIG. 4B is a drawing of an expansion of another block of the flow chart of FIG. 3.

FIG. 4B is a drawing of an expansion of another block of the flow chart of FIG. 3. In FIG. 4B, the expanded block is block 325 which is the step executing a trial for high-to-low transition edge. Block 325 accepts control from block 320 of FIG. 3 and passes control to block 455 in FIG. 4B.

Figure 5B:
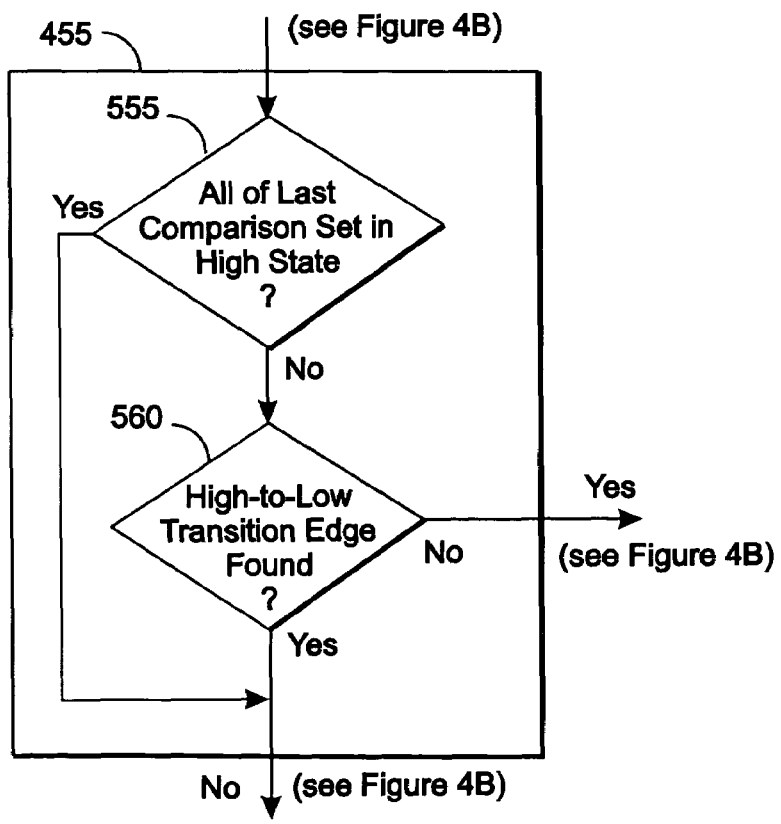
FIG. 5B is a drawing of an expansion of a block of the flow chart of FIG. 4B.

In block 455, if a component bias will be needed at the signal input 115 to obtain initial all high output indications for starting the high-to-low trial, block 455 transfers control to block 460. The details of block 455 are shown in FIG. 5B. Otherwise block 455 transfers control to block 465. Block 455 with its details in FIG. 5B is present to compensate for the presence of hysteresis. In such a situation, it is first necessary to ensure, by force if necessary, that the electronic component 100 is in the high state 225 which is accomplished by the application of an appropriate bias. The effect of this bias is checked and, if necessary, the bias value adjusted at each occurrence of block 325 due to the fact that random fluctuations or drift in the system may result in a bias that is no longer of an appropriate level.

Figure 6B:
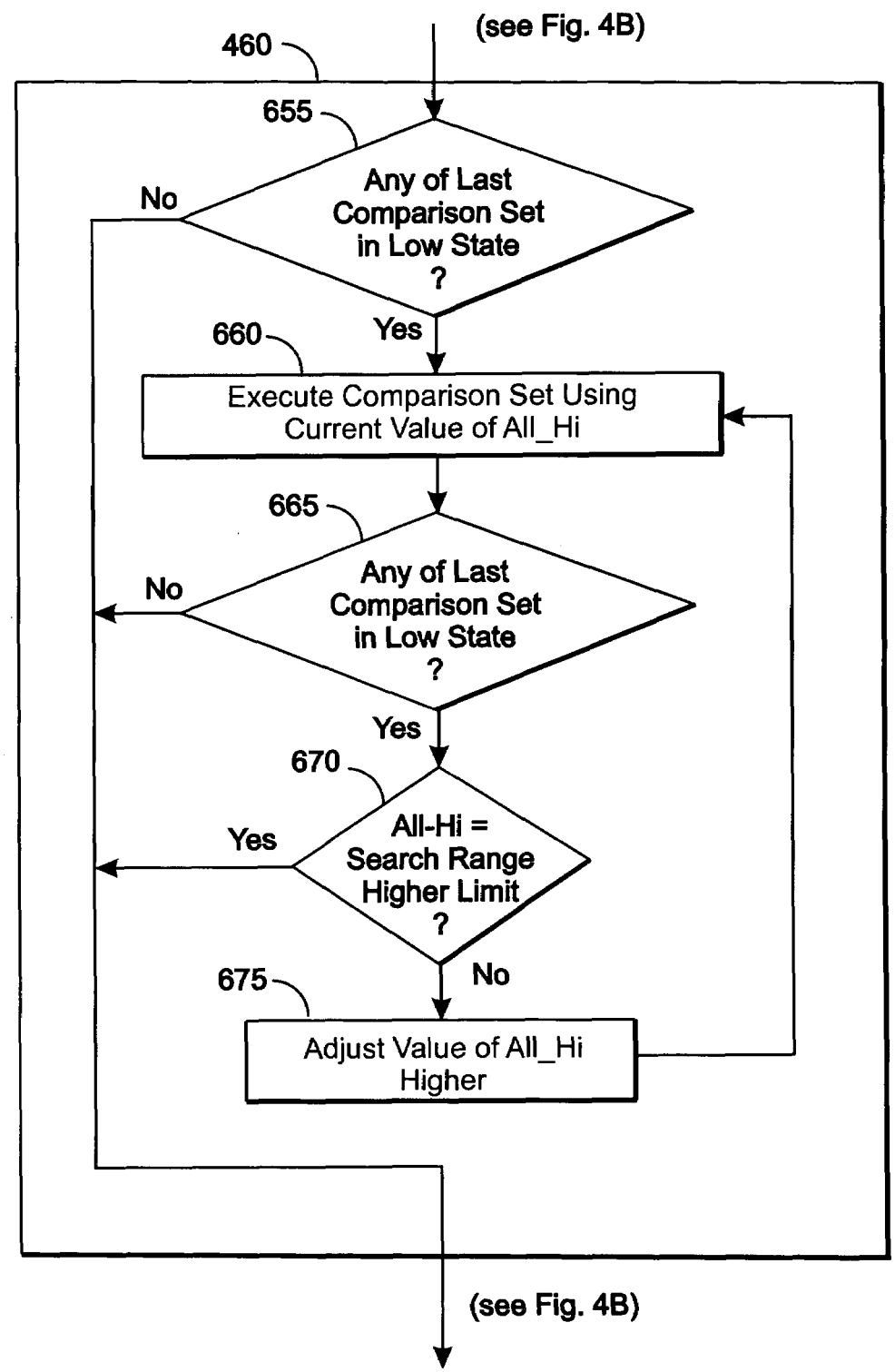
FIG. 6B is a drawing of still another expansion of a block of the flow chart of FIG. 4B.

In block 460, a component bias is applied to the signal input 115 to obtain initial all high comparison results for starting the high-to-low trial. The details of block 460 are shown in FIG. 6B. Block 460 then transfers control to block 465.

In block 465, if the high-to-low search is complete block 465 exits block 325 transferring control to block 330. Otherwise, block 465 transfers control to block 470.

In block 470, the high-to-low trial is executed. In executing the high-to-low trial, the numbers of comparison results indicating high and low (HiCnt and LoCnt, respectively) are set equal to zero. Then the value of the signal input 115 is set to the high-to-low trial value (H2L_Try), and a set of comparisons is performed by making separate observations of the value of the output 120 of the component 100. With each comparison (observation), if the output 120 of the component 100 is in the high state 225, then the number of results indicating high (HiCnt) is incremented by one, while if the output 120 of the component 100 is in the low state 225, then the number of results indicating low (LoCnt) is incremented by one. Block 470 then transfers control to block 475.

In block 475, the search limit parameters are updated per the results of the high-to-low trial of block 470. The details of this update of the search limit parameter(s) are described more fully in the description associated with FIG. 8B. Block 475 then exits block 325 transferring control to block 320.

FIG. 5A is a drawing of an expansion of a block of the flow chart of FIG. 4A. In FIG. 5A, the expanded block is block 405 which is the decision step that asks whether the low-to-high trial needs biasing.

Block 405 accepts control from the input of block 320 of FIG. 4A and passes control to block 505 in FIG. 5A.

In block 505, if all the results of the last trial are in the low state 215, i.e., HiCnt=0, block 505 transfers control to the output of block 405 labeled "NO" shown in FIG. 4A as well as FIG. 5A. Otherwise, block 505 transfers control to block 510.

In block 510, if the low-to-high transition edge has been found, i.e., the low-to-high search is complete, block 510 transfers control to the output of block 405 labeled "NO" shown in FIG. 4A as well as FIG. 5A. Otherwise, block 510 transfers control to the output of block 405 labeled "YES" shown in FIG. 4A as well as FIG. 5A. A criterion that can be used for finding the low-to-high transition edge depends upon the value specified for the minimum search step. In particular, the low-to-high transition edge could be considered found if the absolute difference between upper and lower low-to-high band limits L2H_Hi, L2H_Lo for the low-to-high trial is less than the minimum search step. If this or an appropriate criterion is met, the low-to-high transition edge 270,275 is marked as found.

FIG. 5B is a drawing of an expansion of a block of the flow chart of FIG. 4B. In FIG. 5B, the expanded block is block 455 which is the decision step that asks whether the high-to-low trial needs biasing.

Block 455 accepts control from the input of block 325 of FIG. 4B and passes control to block 555 in FIG. 5B.

In block 555, if all the results of the last trial are in the high state 225, i.e., LoCnt=0, block 555 transfers control to the output of block 455 labeled "NO" shown in FIG. 4B as well as FIG. 5B. Otherwise, block 555 transfers control to block 560.

In block 560, if the high-to-low transition edge has been found, i.e., the high-to-low search is complete, block 560 transfers control to the output of block 455 labeled "NO" shown in FIG. 4B as well as FIG. 5B. Otherwise, block 560 transfers control to the output of block 455 labeled "YES" shown in FIG. 4B as well as FIG. 5B. A criterion that can be used for finding the high-to-low transition edge depends upon the value specified for the minimum search step. In particular, the high-to-low transition edge could be considered found if the absolute difference between upper and lower high-to-low band limits H2L_Hi,H2L_Lo for the high-to-low trial is less than the minimum search step. If this or an appropriate criterion is met, the high-to-low transition edge 270,275 is marked as found.

FIG. 6A is a drawing of still another expansion of a block of the flow chart of FIG. 4A. In FIG. 6A, the expanded block is block 410 which is the block for applying the component bias needed at the signal input 115 to obtain initial all low comparison results for starting the low-to-high trial. Block 410 accepts control from block 405 of FIG. 4A and passes control to block 605 in FIG. 6A.

In block 605, if any result from the last set of comparisons is in the high state 225, i.e., HiCnt>0, block 605 transfers control to block 610. Otherwise, block 605 transfers control to block 415 in FIG. 4A.

In block 610, a set of comparisons is executed using the current value of All_Lo. Block 610 then transfers control to block 615.

In block 615, if any result of the last set of comparisons is in the high state 225, i.e., HiCnt>0, block 615 transfers control to block 620. Otherwise, block 615 transfers control to block 415 in FIG. 4A.

In block 620, if the all low state bias value All_Lo is equal to the lower limit of the search range of the sets of tests to be performed, LoLim, block 620 transfers control to block 415 in FIG. 4A. Otherwise, block 620 transfers control to block 625. Note that the all low state bias value All_Lo will not be lowered below the lower limit of the search range of the sets of tests to be performed, LoLim.

In block 625, the value of the all low state bias value All_Lo is adjusted lower by the minimum search step but will not be lowered below the lower limit of the search range of the sets of tests to be performed, LoLim. The details of block 625 are shown in FIG. 7A. Block 625 then transfers control to block 610.

FIG. 6B is a drawing of still another expansion of a block of the flow chart of FIG. 4B. In FIG. 6B, the expanded block is block 460 which is the block for applying the component bias needed at the signal input 115 to obtain initial all high comparison results for starting the high-to-low trial. Block 460 accepts control from block 455 of FIG. 4B and passes control to block 655 in FIG. 6B.

In block 655, if any of result from the last set of comparisons is in the low state 215, i.e., LoCnt>0, block 655 transfers control to block 660. Otherwise, block 655 transfers control to block 465 in FIG. 4B.

In block 660, a set of comparisons is executed using the current value of All_Hi. Block 660 then transfers control to block 665.

In block 665, if any result of the last set of comparisons is in the low state 215, i.e., LoCnt>0, block 665 transfers control to block 670. Otherwise, block 665 transfers control to block 465 in FIG. 4B.

In block 670, if the all high state bias value All_Hi is equal to the higher limit of the search range of the sets of tests to be performed, HiLim, block 670 transfers control to block 465 in FIG. 4B. Otherwise, block 670 transfers control to block 675. Note that the all high state bias value All_Hi will not be raised above the upper limit of the search range of the sets of tests to be performed, HiLim.

In block 675, the value of the all high state bias value All_Hi is adjusted higher by the minimum search step but will not be raised above the upper limit of the search range of the sets of tests to be performed, HiLim. The details of block 675 are shown in FIG. 7B. Block 675 then transfers control to block 660.

FIG. 7A is a drawing of an expansion of a block of the flow chart of FIG. 6A. In FIG. 7A, the expanded block is block 625 which is the block for adjusting the value of the all low state bias value All_Lo lower. Block 625 accepts control from block 620 of FIG. 6A and passes control to block 705 in FIG. 7A.

In block 705, if the value of the all low state bias value All_Lo is greater than the lower limit of the search range of the sets of tests to be performed LoLim plus the value of the minimum search step, block 705 transfers control to block 710. Otherwise, block 705 transfers control to block 715.

In block 710, the all low state bias value All_Lo is decreased by the value of the minimum search step. Block 710 then transfers control to block 610 in FIG. 6A.

In block 715, the all low state bias value All_Lo is set equal to the lower limit of the search range of the sets of tests to be performed LoLim. Block 715 then transfers control to block 610 in FIG. 6A.

FIG. 7B is a drawing of an expansion of a block of the flow chart of FIG. 6B. In FIG. 7B, the expanded block is block 675 which is the block for adjusting the value of the all high state bias value All_Hi higher. Block 675 accepts control from block 670 of FIG. 6B and passes control to block 755 in FIG. 7B.

In block 755, if the value of the all high state bias value All_Hi is less than the upper limit of the search range of the sets of tests to be performed HiLim minus the value of the minimum search step, block 755 transfers control to block 760. Otherwise, block 755 transfers control to block 765.

In block 760, the all high state bias value All_Hi is increased by the value of the minimum search step. Block 760 then transfers control to block 660 in FIG. 6B.

In block 765, the all high state bias value All_Hi is set equal to the upper limit of the search range of the sets of tests to be performed HiLim. Block 765 then transfers control to block 660 in FIG. 6B.

Figure 8A:
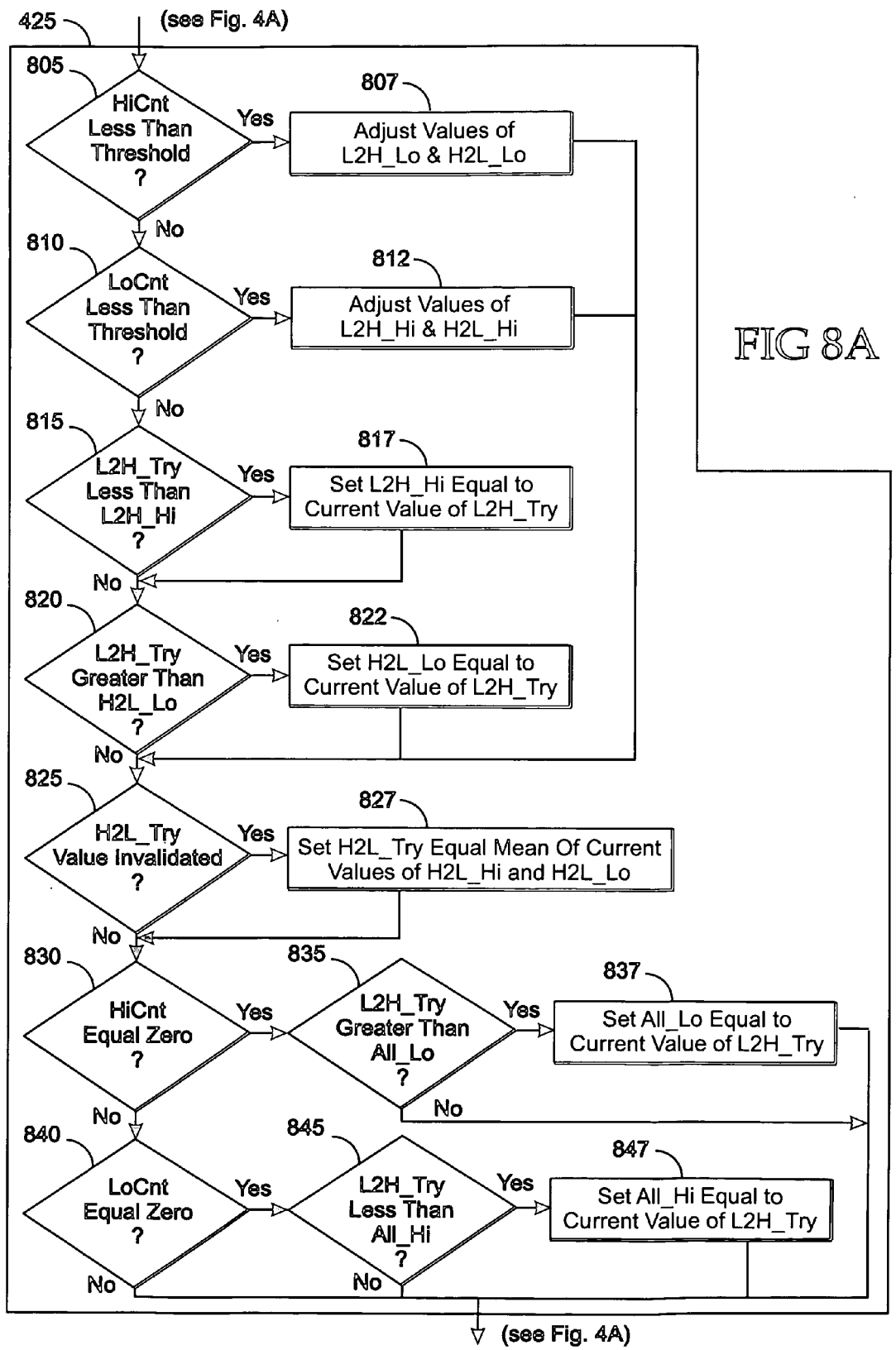
FIG. 8A is a drawing of an expansion of yet another block of the flow chart of FIG. 4A.

FIG. 8A is a drawing of an expansion of yet another block of the flow chart of FIG. 4A. In FIG. 8A, the expanded block is block 425 which is the block in which the search limit parameters are updated based on results of a low-to-high trial.

The flow chart of FIG. 8A contains three alternative update scenarios. After the execution of each low-to-high trial, one of three results are possible as follows: (1) so few high results were obtained that the trial value is clearly below the transition range the user is searching for, (2) so few low results were obtained that the trial value is clearly above the transition range that the user is looking for, and (3) the mix of high and low results is such that it cannot be stated that the trial value is clearly below or clearly above the transition range and that the trial value is therefore somewhere in between the edges of the transition range. The first of these possible results is used by blocks 805 and 807 in updating search parameter values. The second is used by blocks 810 and 812 in updating search parameter values. While the third is used by blocks 815, 817, 820, and 822 in updating search parameter values. Note that block 807 is expanded in FIG. 9A and block 812 is expanded in FIG. 9B.

Block 425 accepts control from block 420 of FIG. 4A and passes control to block 805 in FIG. 8A.

In block 805, if the number of "high" comparison outcomes HiCnt in the previous trial is less than the transition threshold that is specified to be proof of a transition, block 805 transfers control to block 807. Otherwise, block 805 transfers control to block 810.

In block 807, values for the low-to-high lower limit L2H_Lo and the high-to-low lower limit H2L_Lo are adjusted based on the current values for the low-to-high trial value L2H_Try, the low-to-high lower limit L2H_Lo and the high-to-low lower limit H2L_Lo. The details of these computations for the new values of the low-to-high lower limit L2H_Lo and the high-to-low lower limit H2L_Lo are described more fully in the description associated with FIG. 9A. Block 807 addresses the case in which the lower edge of the transition zone in which the transition can be assumed to occur based on the predefined value for the transition threshold lies above the low-to-high trial value L2H_Try for the previous trial. Block 807 then transfers control to block 825.

In block 810, if the number of "low" comparison outcomes LoCnt in the previous trial is less than the transition threshold that is specified to be proof of a transition, block 810 transfers control to block 812. Otherwise, block 810 transfers control to block 815.

In block 812, values for the low-to-high higher limit L2H_Hi and the high-to-low higher limit H2L_Hi are adjusted based on the current values for the low-to-high trial value L2H_Try, the low-to-high higher limit L2H_Hi and the high-to-low higher limit H2L_Hi. The details of these computations for the new values of the low-to-high higher limit L2H_Hi and the high-to-low higher limit H2L_Hi are described more fully in the description associated with FIG. 9B. Block 812 addresses the case in which the upper edge of the transition zone in which the transition can be assumed to occur based on the predefined value for the transition threshold lies below the low-to-high trial value L2H_Try for the previous trial. Block 812 then transfers control to block 825.

In block 815, if the current value of the low-to-high trial value L2H_Try is less than the current value of the low-to-high upper limit L2H_Hi, block 815 transfers control to block 817. Otherwise, block 815 transfers control to block 820.

Blocks 815, 817, 820, and 822 address the case in which the low-to-high trial value L2H_Try for the previous trial is assumed to lie above the lower edge of the transition zone in which the transition can be assumed to occur based on the predefined value for the transition threshold and below the upper edge of the transition zone in which the transition can be assumed to occur again based on the predefined value for the transition threshold.

In block 817, the value for the low-to-high higher limit L2H_Hi is set equal to the value of the low-to-high trial value L2H_Try for the previous trial. Block 817 then transfers control to block 820.

In block 820, if the current value of the low-to-high trial value L2H_Try is greater than the current value of the high-to-low lower limit H2L_Lo, block 820 transfers control to block 822. Otherwise, block 820 transfers control to block 825.

In block 822, the value for the high-to-low lower limit H2L_Lo is set equal to the value of the low-to-high trial value L2H_Try for the previous trial. Block 822 then transfers control to block 825.

In block 825, if the current value of the high-to-low trial value H2L_Try is invalidated, block 825 transfers control to block 827. The details of the determination as to the validity of the high-to-low trial value H2L_Try are described more fully in the description associated with FIG. 10. Otherwise, block 825 transfers control to block 830.

In block 827, the value for the high-to-low trial value H2L_Try is set equal to the mean of the current values for the high-to-low upper limit H2L_Hi and the high-to-low lower limit H2L_Lo. Block 827 then transfers control to block 830.

In block 830, if the number of "high" comparison outcomes HiCnt in the previous trial is equal to zero, block 830 transfers control to block 835. Otherwise, block 830 transfers control to block 840.

In block 835, if the current value of the low-to-high trial value L2H_Try is greater than the current value of the all low state bias value All_Lo, block 835 transfers control to block 837. Otherwise, block 835 transfers control to block 325 in FIG. 3 (see also block 425 in FIG. 4A).

In block 837, the value for the all low state bias value All_Lo is set equal to the current value of the low-to-high trial value L2H_Try. Block 837 then transfers control to block 325 in FIG. 3 (see also block 425 in FIG. 4A). Block 837 is reached by way of blocks 830 and 835 with the result in block 837 that the all low state bias value All_Lo is pulled in, i.e., pulled up. This is done so that when the component 100 is biased, the application of signals over wide ranges is not forced. Progressively smaller and smaller signal movements are applied as the search progresses so that as little noise as possible is introduced into the system.

In block 840, if the number of "low" comparison outcomes LoCnt in the previous trial is equal to zero, block 840 transfers control to block 845. Otherwise, block 840 transfers control to block 325 in FIG. 3 (see also block 425 in FIG. 4A).

In block 845, if the current value of the low-to-high trial value L2H_Try is less than the current value of the all high state bias value All_Hi, block 845 transfers control to block 847. Otherwise, block 845 transfers control to block 325 in FIG. 3 (see also block 425 in FIG. 4A).

In block 847, the value for the all high state bias value All_Hi is set equal to the current value of the low-to-high trial value L2H_Try. Block 847 then transfers control to block 325 in FIG. 3 (see also block 425 in FIG. 4A). Block 847 is reached by way of blocks 840 and 845 with the result in block 847 that the all high state bias value All_Hi is pulled in, i.e., pulled down. This is done so that when the component 100 is biased, the application of signals over wide ranges is not forced. Progressively smaller and smaller signal movements are applied as the search progresses so that as little noise as possible is introduced into the system.

Figure 8B:
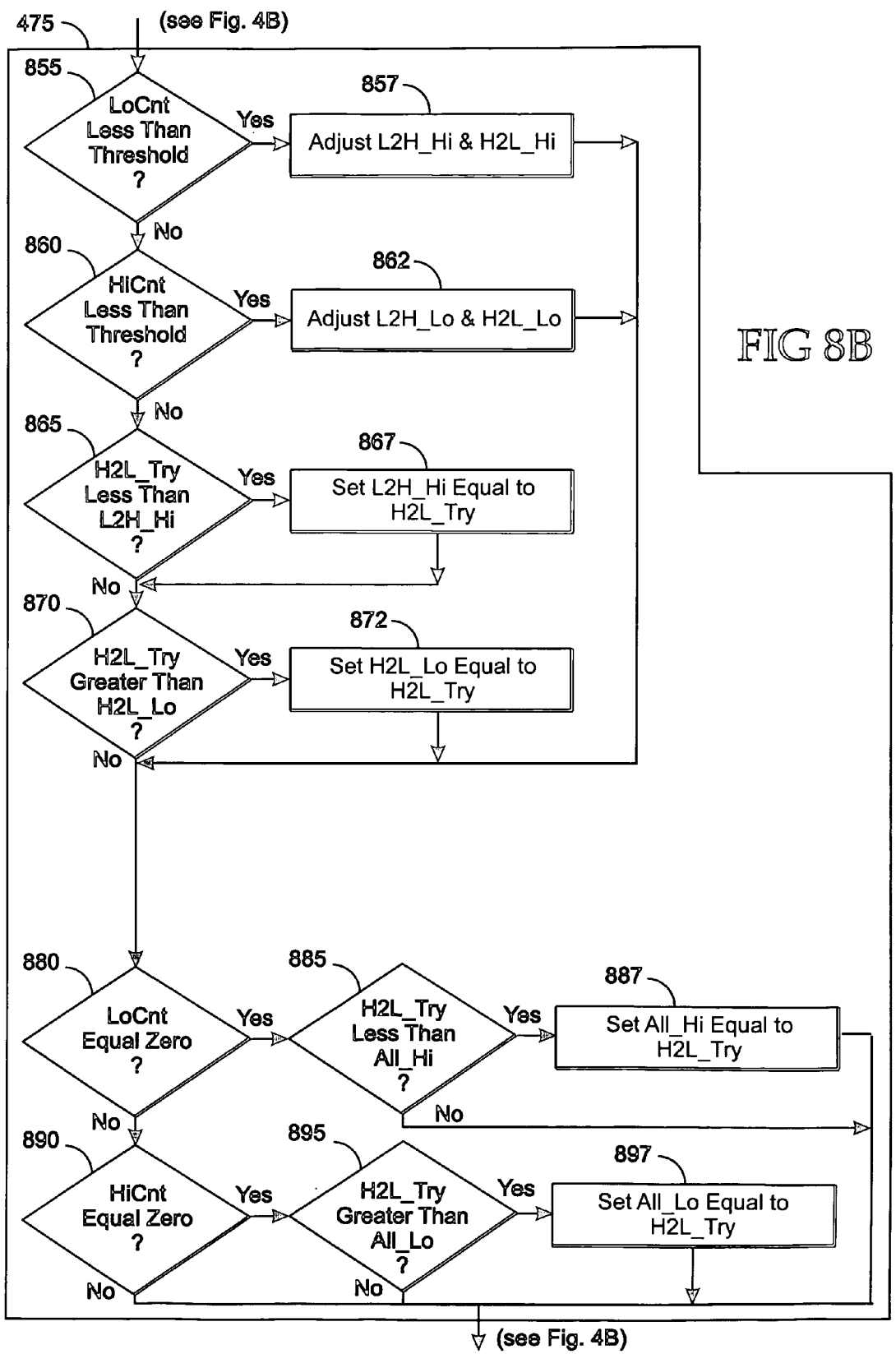
FIG. 8B is a drawing of an expansion of yet another block of the flow chart of FIG. 4B.

FIG. 8B is a drawing of an expansion of yet another block of the flow chart of FIG. 4B. In FIG. 8B, the expanded block is block 475 which is the block in which the search limit parameters are updated based on results of a high-to-low trial.

The flow chart of FIG. 8B contains three alternative update scenarios. After the execution of each high-to-low trial, one of three results are possible as follows: (1) so few low results were obtained that the trial value is clearly above the transition range the user is searching for, (2) so few high results were obtained that the trial value is clearly below the transition range that the user is looking for, and (3) the mix of high and low results is such that it cannot be stated that the trial value is clearly below or clearly above the transition range and that the trial value is therefore somewhere in between the edges of the transition range. The first of these possible results is used by blocks 855 and 857 in updating search parameter values. The second is used by blocks 860 and 862 in updating search parameter values. While the third is used by blocks 865, 867, 870, and 872 in updating search parameter values. Note that block 857 is expanded in FIG. 9C and block 862 is expanded in FIG. 9D.

Block 475 accepts control from block 470 of FIG. 4B and passes control to block 855 in FIG. 8B.

In block 855, if the number of "low" comparison outcomes LoCnt in the previous trial is less than the transition threshold that is specified to be proof of a transition, block 855 transfers control to block 857. Otherwise, block 855 transfers control to block 860.

In block 857, values for the low-to-high higher limit L2H_Hi and the high-to-low higher limit H2L_Hi are adjusted based on the current values for the high-to-low trial value H2L_Try, the low-to-high higher limit L2H_Hi and the high-to-low higher limit H2L_Hi. The details of these computations for the new values of the low-to-high higher limit L2H_Hi and the high-to-low higher limit H2L_H are described more fully in the description associated with FIG. 9C. Block 857 addresses the case in which the higher edge of the transition zone in which the transition can be assumed to occur based on the predefined value for the transition threshold lies below the high-to-low trial value H2L_Try for the previous trial. Block 857 then transfers control to block 880.

In block 860, if the number of "high" comparison outcomes HiCnt in the previous trial is less than the transition threshold that is specified to be proof of a transition, block 860 transfers control to block 862. Otherwise, block 860 transfers control to block 865.

In block 862, values for the low-to-high lower limit L2H_Lo and the high-to-low lower limit H2L_Lo are adjusted based on the current values for the high-to-low trial value H2L_Try, the low-to-high lower limit L2H_Lo and the high-to-low lower limit H2L_Lo. The details of these computations for the new values of the low-to-high lower limit L2H_Lo and the high-to-low lower limit H2L_Lo are described more fully in the description associated with FIG. 9D. Block 862 addresses the case in which the upper edge of the transition zone in which the transition can be assumed to occur based on the predefined value for the transition threshold lies above the high-to-low trial value H2L_Try for the previous trial. Block 862 then transfers control to block 880.

In block 865, if the current value of the high-to-low trial value H2L_Try is less than the current value of the low-to-high upper limit L2H_Hi, block 865 transfers control to block 867. Otherwise, block 865 transfers control to block 870.

Blocks 865, 867, 870, and 872 address the case in which the high-to-low trial value H2L_Try for the previous trial is assumed to lie above the lower edge of the transition zone in which the transition can be assumed to occur based on the predefined value for the transition threshold and below the upper edge of the transition zone in which the transition can be assumed to occur again based on the predefined value for the transition threshold.

In block 867, the value for the low-to-high higher limit L2H_Hi is set equal to the value of the high-to-low trial value H2L_Try for the previous trial. Block 867 then transfers control to block 870.

In block 870, if the current value of the high-to-low trial value H2L_Try is greater than the current value of the high-to-low lower limit H2L_Lo, block 870 transfers control to block 872. Otherwise, block 870 transfers control to block 880.

In block 872, the value for the high-to-low lower limit H2L_Lo is set equal to the value of the high-to-low trial value H2L_Try for the previous trial. Block 872 then transfers control to block 880.

In block 880, if the number of "low" comparison outcomes LoCnt in the previous trial is equal to zero, block 880 transfers control to block 885. Otherwise, block 880 transfers control to block 890.

In block 885, if the current value of the high-to-low trial value H2L_Try is less than the current value of the all high state bias value All_Hi, block 885 transfers control to block 887. Otherwise, block 885 transfers control to block 330 in FIG. 3 (see also block 475 in FIG. 4B).

In block 887, the value for the all high state bias value All_Hi is set equal to the current value of the high-to-low trial value H2L_Try. Block 887 then transfers control to block 330 in FIG. 3 (see also block 475 in FIG. 4B). Block 887 is reached by way of blocks 880 and 885 with the result in block 887 that the all high state bias value All_Hi is pulled in, i.e., pulled down. This is done so that when the component 100 is biased, the application of signals over wide ranges is not forced. Progressively smaller and smaller signal movements are applied as the search progresses so that as little noise as possible is introduced into the system.

In block 890, if the number of "high" comparison outcomes HiCnt in the previous trial is equal to zero, block 890 transfers control to block 895. Otherwise, block 890 transfers control to block 330 in FIG. 3 (see also block 475 in FIG. 4B).

In block 895, if the current value of the high-to-low trial value H2L_Try is greater than the current value of the all low state bias value All_Lo, block 895 transfers control to block 897. Otherwise, block 895 transfers control to block 330 in FIG. 3 (see also block 475 in FIG. 4B).

In block 897, the value for the all low state bias value All_Lo is set equal to the current value of the high-to-low trial value H2L_Try. Block 897 then transfers control to block 330 in FIG. 3 (see also block 475 in FIG. 4B). Block 897 is reached by way of blocks 890 and 895 with the result in block 897 that the all low state bias value All_Lo is pulled in, i.e., pulled up. This is done so that when the component 100 is biased, the application of signals over wide ranges is not forced. Progressively smaller and smaller signal movements are applied as the search progresses so that as little noise as possible is introduced into the system.

Figure 9A:
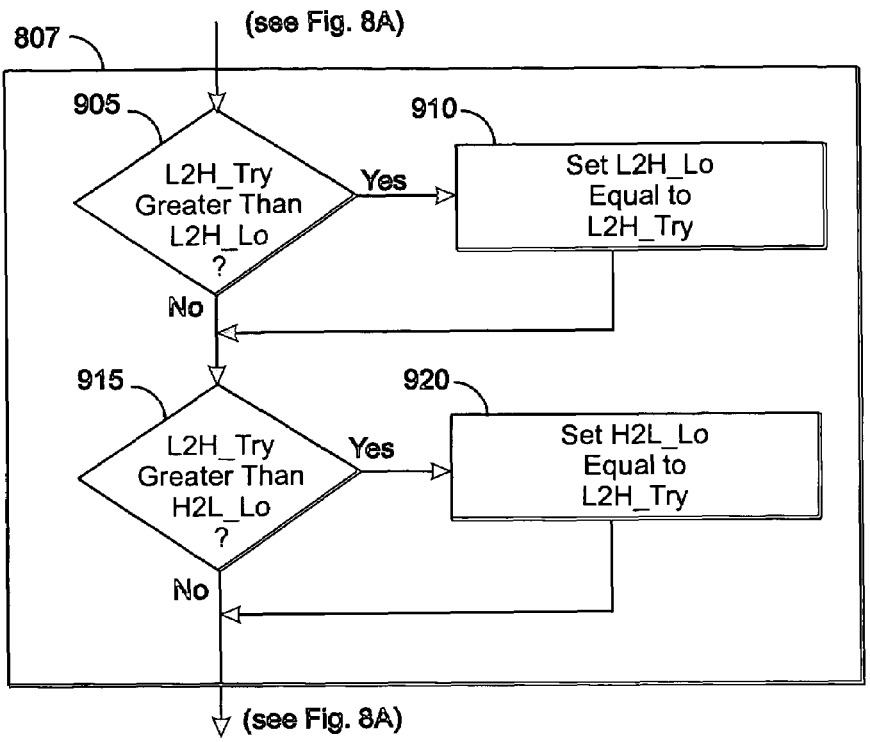
FIG. 9A is a drawing of an expansion of a block of the flow chart of FIG. 8A.

FIG. 9A is a drawing of an expansion of a block of the flow chart of FIG. 8A. In FIG. 9A, the expanded block is block 807 which is the block in which the values for the low-to-high lower limit L2H_Lo and the high-to-low lower limit H2L_Lo are adjusted based on the current values for the low-to-high trial value L2H_Try, the low-to-high lower limit L2H_Lo and the high-to-low lower limit H2L_Lo. Block 807 accepts control from the output of block 805 labeled "YES" as shown in FIG. 8A and passes control to block 905 in FIG. 9A.

In block 905, if the current value of the low-to-high trial value L2H_Try is greater than the current value of the low-to-high lower limit L2H_Lo, block 905 transfers control to block 910. Otherwise, block 905 transfers control to block 915.

In block 910, the value for the low-to-high lower limit L2H_Lo is set equal to the current value of the low-to-high trial value L2H_Try. Block 910 then transfers control to block 915.

In block 915, if the current value of the low-to-high trial value L2H_Try is greater than the current value of the high-to-low lower limit H2L_Lo, block 915 transfers control to block 920. Otherwise, block 915 transfers control to block 825 in FIG. 8A.

In block 920, the value for the high-to-low lower limit H2L_Lo is set equal to the current value of the low-to-high trial value L2H_Try. Block 920 then transfers control to block 825 in FIG. 8A.

Figure 9B:
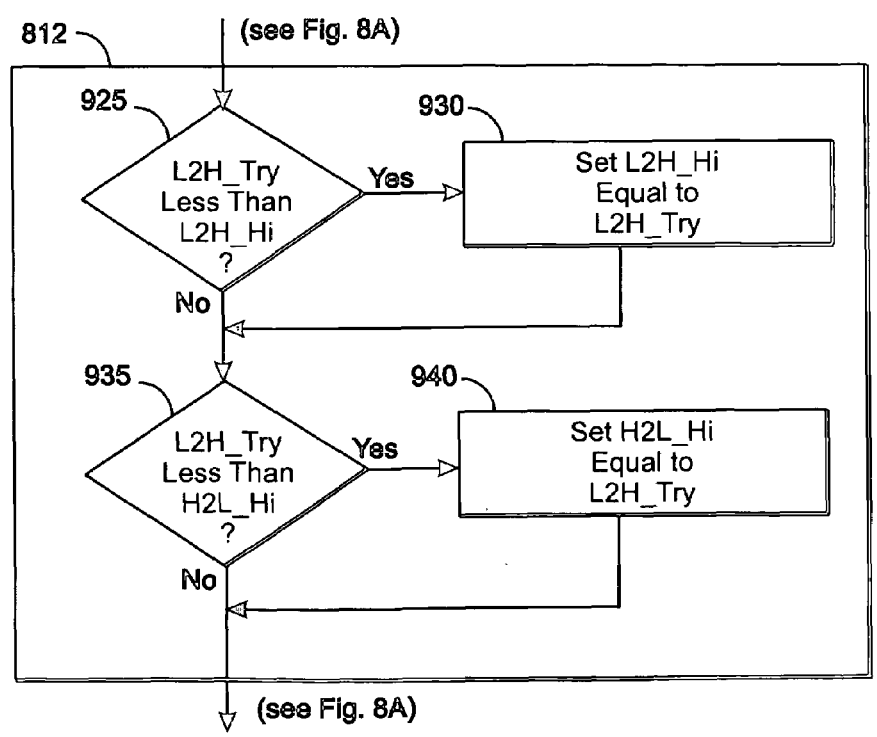
FIG. 9B is a drawing of an expansion of another block of the flow chart of FIG. 8A.

FIG. 9B is a drawing of an expansion of another block of the flow chart of FIG. 8A. In FIG. 9B, the expanded block is block 812 which is the block in which the values for the low-to-high higher limit L2H_Hi and the high-to-low higher limit H2L_Hi are adjusted based on the current values for the low-to-high trial value L2H_Try, the low-to-high higher limit L2H_Hi and the high-to-low higher limit H2L_Hi. Block 812 accepts control from the output of block 810 labeled "YES" as shown in FIG. 8A and passes control to block 925 in FIG. 9B.

In block 925, if the current value of the low-to-high trial value L2H_Try is less than the current value of the low-to-high higher limit L2H_Hi, block 925 transfers control to block 930. Otherwise, block 925 transfers control to block 935.

In block 930, the value for the low-to-high higher limit L2H_Hi is set equal to the current value of the low-to-high trial value L2H_Try. Block 930 then transfers control to block 935.

In block 935, if the current value of the low-to-high trial value L2H_Try is less than the current value of the high-to-low higher limit H2L_Hi, block 935 transfers control to block 940. Otherwise, block 935 transfers control to block 825 in FIG. 8A.

In block 940, the value for the high-to-low higher limit H2L_Hi is set equal to the current value of the low-to-high trial value L2H_Try. Block 940 then transfers control to block 825 in FIG. 8A.

Figure 9C:
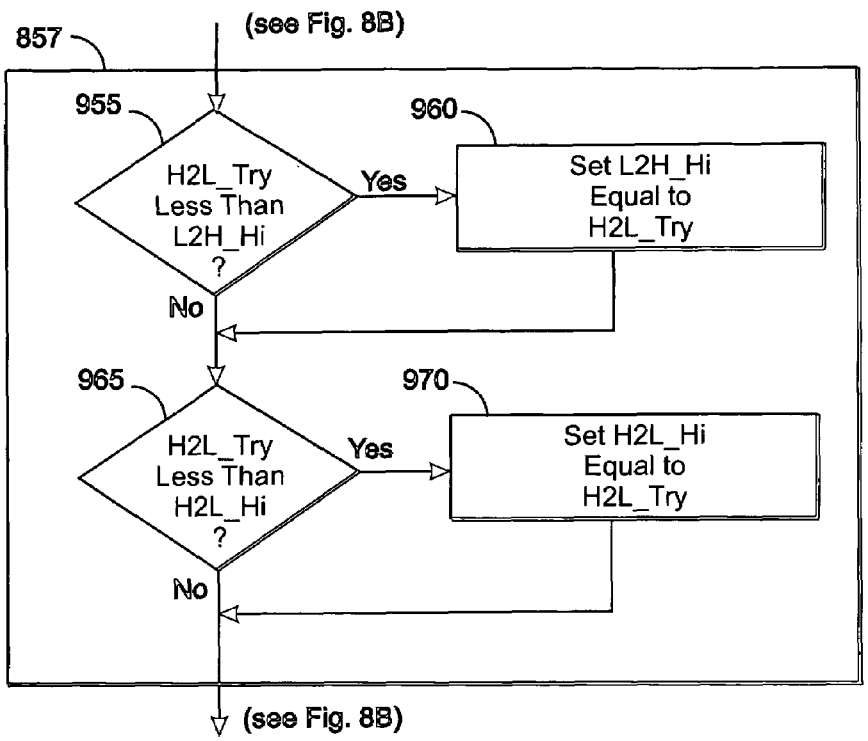
FIG. 9C is a drawing of an expansion of a block of the flow chart of FIG. 8B.

FIG. 9C is a drawing of an expansion of a block of the flow chart of FIG. 8B. In FIG. 9C, the expanded block is block 857 which is the block in which the values for the low-to-high higher limit L2H_Hi and the high-to-low higher limit H2L_Hi are adjusted based on the current values for the high-to-low trial value H2L_Try, the low-to-high higher limit L2H_Hi and the high-to-low higher limit H2L_Hi. Block 857 accepts control from the output of block 855 labeled "YES" as shown in FIG. 8B and passes control to block 955 in FIG. 9C.

In block 955, if the current value of the high-to-low trial value H2L_Try is less than the current value of the low-to-high higher limit L2H_Hi, block 955 transfers control to block 960. Otherwise, block 955 transfers control to block 965.

In block 960, the value for the low-to-high higher limit L2H_Hi is set equal to the current value of the high-to-low trial value H2L_Try. Block 960 then transfers control to block 965.

In block 965, if the current value of the high-to-low trial value H2L_Try is less than the current value of the high-to-low higher limit H2L_Hi, block 965 transfers control to block 970. Otherwise, block 965 transfers control to block 880 in FIG. 8B.

In block 970, the value for the high-to-low higher limit H2L_Hi is set equal to the current value of the high-to-low trial value H2L_Try. Block 970 then transfers control to block 880 in FIG. 8B.

Figure 9D:
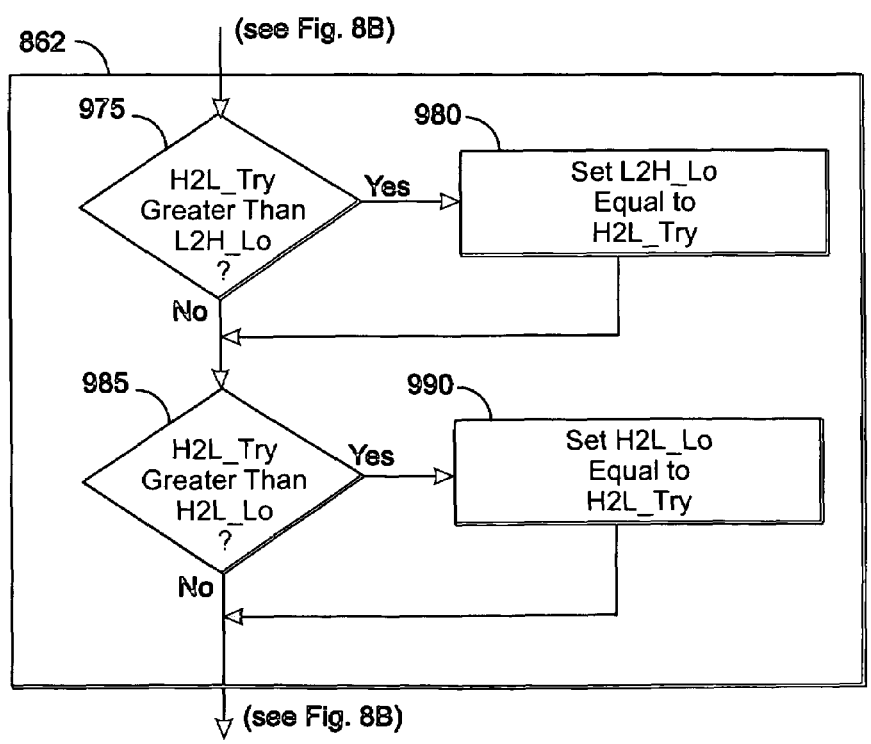
FIG. 9D is a drawing of an expansion of another block of the flow chart of FIG. 8B.

FIG. 9D is a drawing of an expansion of another block of the flow chart of FIG. 8B. In FIG. 9D, the expanded block is block 862 which is the block in which the values for the low-to-high lower limit L2H_Lo and the high-to-low lower limit H2L_Lo are adjusted based on the current values for the high-to-low trial value H2L_Try, the low-to-high lower limit L2H_Lo and the high-to-low lower limit H2L_Lo. Block 862 accepts control from the output of block 860 labeled "YES" as shown in FIG. 8B and passes control to block 975 in FIG. 9D.

In block 975, if the current value of the high-to-low trial value H2L_Try is greater than the current value of the low-to-high lower limit L2H_Lo, block 975 transfers control to block 980. Otherwise, block 975 transfers control to block 985.

In block 980, the value for the low-to-high lower limit L2H_Lo is set equal to the current value of the high-to-low trial value H2L_Try. Block 980 then transfers control to block 985.

In block 985, if the current value of the high-to-low trial value H2L_Try is greater than the current value of the high-to-low lower limit H2L_Lo, block 985 transfers control to block 990. Otherwise, block 985 transfers control to block 880 in FIG. 8B.

In block 990, the value for the high-to-low lower limit H2L_Lo is set equal to the current value of the high-to-low trial value H2L_Try. Block 990 then transfers control to block 880 in FIG. 8B.

Figure 10:
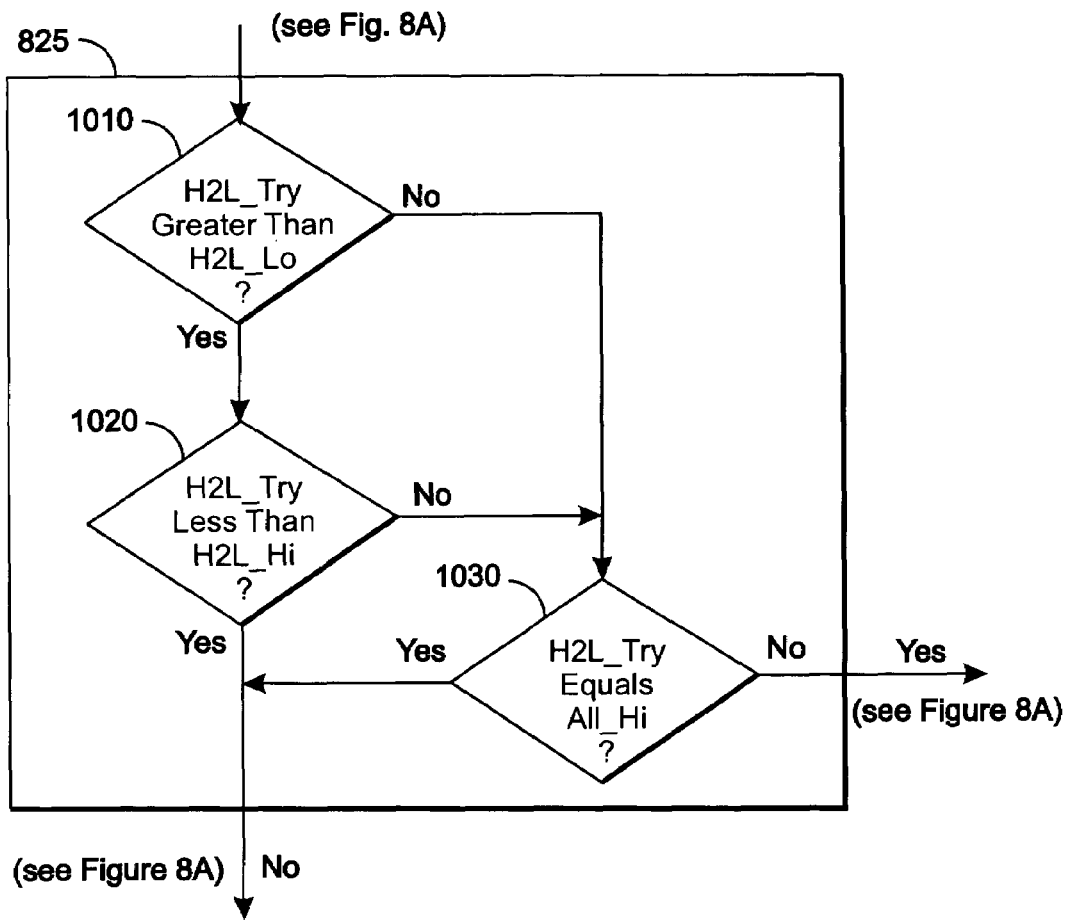
FIG. 10 is a drawing of an expansion of still another block of the flow chart of FIG. 8A.

FIG. 10 is a drawing of an expansion of still another block of the flow chart of FIG. 8A. In FIG. 10, the expanded block is block 825 which is the block in which the determination as to the validity of the high-to-low trial value H2L_Try is made. Block 825 accepts control from the output of block 820 labeled "NO" and from the outputs of blocks 807, 812, and 822 as shown in FIG. 8A and passes control to block 1010 in FIG. 10.

In block 1010, if the current value of the high-to-low trial value H2L_Try is greater than the current value of the high-to-low lower limit H2L_Lo, block 1010 transfers control to block 1020. Otherwise, block 1010 transfers control to block 1030.

In block 1020, if the current value of the high-to-low trial value H2L_Try is less than the current value of the high-to-low higher limit H2L_Hi, block 1020 transfers control to block 830 in FIG. 8A. Otherwise, block 1020 transfers control to block 1030.

In block 1030, if the current value of the high-to-low trial value H2L_Try equals the current value of the all high state bias value All_Hi, block 1030 transfers control to block 830 in FIG. 8A. Otherwise, block 1030 transfers control to block 827 in FIG. 8A.

FIG. 11 is a drawing of an expansion of still another block of the flow chart of FIG. 3. In FIGS. 3 and 11, the expanded block is block 335 which is the block in which new trial value(s) are computed as appropriate. Block 335 accepts control from the output of block 330 labeled "NO" as shown in FIG. 3 and passes control to block 1105 in FIG. 11.

In block 1105, if the current value of the low-to-high lower limit L2H_Lo equals the current value of the high-to-low lower limit H2L_Lo, block 1105 transfers control to block 1110. Otherwise, block 1105 transfers control to block 1120.

In block 1110, if the current value of the low-to-high higher limit L2H_Hi equals the current value of the high-to-low higher limit H2L_Hi, block 1110 transfers control to block 1115. Otherwise, block 1110 transfers control to block 1120.

In block 1115, a Boolean parameter Identical_Tries is set to TRUE. The Boolean parameter Identical_Tries is used to indicate that the new trial values to be calculated (the low-to-high trial value L2H_Try and the high-to-low trial value H2L_Try) could be equal unless action is taken. Thus, it is possible for two trials to be run consecutively using the same trial value which is wasteful of resources. Block 1115 then transfers control to block 1125.

In block 1120, the Boolean parameter Identical_Tries is set to FALSE. Block 1120 then transfers control to block 1125.

In block 1125, if the low-to-high state has been found, block 1125 transfers control to block 1145. Otherwise, block 1125 transfers control to block 1130.

In block 1130, the low-to-high trial value L2H_Try is set equal to the mean of the current value of the low-to-high lower limit L2H_Lo and the current value of the low-to-high higher limit L2H_Hi. Block 1130 then transfers control to block 1135.

In block 1135, if the Boolean parameter Identical_Tries is set to TRUE, block 1135 transfers control to block 1140. Otherwise, block 1135 transfers control to block 1145.

In block 1140, the low-to-high trial value L2H_Try is lowered by one-third of the difference between the current value of the low-to-high trial value L2H_Try and the current value of the low-to-high lower limit L2H_Lo. Thus, the value for the low-to-high trial value L2H_Try is separated from the soon to be computed high-to-low trial value H2L_Try rather than perform two tests at the same trial signal level. Block 1140 then transfers control to block 1145.

In block 1145, if the high-to-low state has been found, block 1145 transfers control to block 320 on FIG. 3. Otherwise, block 1145 transfers control to block 1150.

In block 1150, the high-to-low trial value H2L_Try is set equal to the mean of the current value of the high-to-low lower limit H2L_Lo and the current value of the high-to-low higher limit H2L_Hi. Block 1150 then transfers control to block 1155.

In block 1155, if the Boolean parameter Identical_Tries is set to TRUE, block 1155 transfers control to block 1160. Otherwise, block 1155 transfers control to block 320 on FIG. 3.

In block 1160, the high-to-low trial value H2L_Try is raised by one-third of the difference between the current value of the high-to-low upper limit H2L_Hi and the high-to-low trial value H2L_Try. Thus, the value for the high-to-low trial value H2L_Try is separated from what would have been the low-to-high trial value L2H_Try rather than perform two tests at the same trial signal level. Block 1160 then transfers control to block 320 on FIG. 3.

As is the case, in many data-processing products, the systems described above may be implemented as a combination of hardware and software components. Moreover, the functionality required for use of the representative embodiments may be embodied in computer-readable media (such as floppy disks, conventional hard disks, DVDs, CD-ROMs, Flash ROMs, nonvolatile ROM, and RAM among others) to be used in programming an information-processing apparatus (e.g., the test machine 105 comprising the elements shown in FIG. 1 among others) to perform in accordance with the techniques so described.

The term "program storage medium" is broadly defined herein to include any kind of computer memory such as, but not limited to, floppy disks, conventional hard disks, DVDs, CD-ROMs, Flash ROMs, nonvolatile ROM, and RAM.

The central processing unit 125 of the test machine 105, can be capable of running one or more of any commercially available operating system such as DOS, various versions of Microsoft Windows (Windows 95, 98, Me, 2000, NT, XP, or the like), Apple's MAC OS X, UNIX, Linux, or other suitable operating system.

Representative embodiments disclosed herein can be implemented as an application program which can be written using a variety of programming languages including Visual Basic, C/C++, assembler or any other commercially-available programming tools.

In a representative embodiments of the methods described herein efficient techniques are disclosed for determining the range of signal levels at which an electronic component such as a comparator switches from one state to another in the presence of noise and/or hysteresis. These techniques comprise a double-ended binary search for the upper and lower limits of this range of signal levels. The present search techniques are typically faster than previous techniques which most often include a pair of linear searches.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A method for testing an electronic component, comprising:
specifying search range limits, low-to-high transition edge and high-to-low transition edge found criterion, and number of comparison outcomes in a trial comprising multiple tests specified as proof of a low-to-high transition edge or as proof of a high-to-low transition edge;
computing initial values for trial parameters using the search range limits, wherein the trial parameters comprise: low-to-high band limits for a low-to-high trial and a low-to-high trial value, high-to-low band limits for a high-to-low trial and a high-to-low trial value, and number of high indicating comparison outcomes from an assumed previous trial;
specifying the low-to-high transition edge and the high-to-low transition edge as not found;
if low-to-high transition edge not found:
executing the low-to-high trial on the electronic component resulting in various low and high indicating comparison outcomes and
adjusting part of the trial parameter values based on results of executing the low-to-high trial;
if high-to-low transition edge not found:
executing the high-to-low trial on the electronic component resulting in various low and high indicating comparison outcomes and
adjusting another part of the trial parameter values based on results of executing the high-to-low trial;
if the results of the low-to-high trial meet the low-to-high transition edge found criterion:
specifying the low-to-high transition edge as found;
if the results of the high-to-low trial meet the high-to-low transition edge found criterion:
specifying the high-to-low transition edge as found;
if either low-to-high or high-to-low transition edge not found:
adjusting still another part of the trial parameter values based on results of the above executed trials and
repeating the above beginning with the condition if low-to-high transition edge not found; and
storing the final trial parameter values.

2. The method as recited in claim 1, further comprising:
prior to executing the low-to-high trial, ensuring that the electronic component is in its low state; and
prior to executing the high-to-low trial, ensuring that the electronic component is in its high state.

3. The method as recited in claim 1, wherein the low-to-high transition edge found criterion and the high-to-low transition edge found criterion depend upon a value specified for a resolution limit of the search.

4. The method as recited in claim 3, further comprising:
if the absolute difference between upper and lower low-to-high band limits for the low-to-high trial is less than the resolution limit of the search, marking the low-to-high transition edge as found; and
if the absolute difference between upper and lower high-to-low band limits for the high-to-low trial is less than the resolution limit of the search, marking the high-to-low transition edge as found.

5. The method as recited in claim 1, further comprising:
computing the low-to-high trial value based on the upper and lower low-to-high band limits; and
computing the high-to-low trial value based on the upper and lower high-to-low band limits.

6. The method as recited in claim 5, wherein if either the upper low-to-high band limit does not equal the upper high-to-low band limit or if the lower low-to-high band limit does not equal the lower high-to-low band limit, the computed low-to-high trial value is equal to one-half the sum of the upper low-to-high band limit and the lower low-to-high band limit and the computed high-to-low trial value is equal to one-half the sum of the upper high-to-low band limit and the lower high-to-low band limit.

7. The method as recited in claim 5, wherein if the upper low-to-high band limit equals the upper high-to-low band limit and if the lower low-to-high band limit equals the lower high-to-low band limit, the computed low-to-high trial value is equal to the sum of the lower low-to-high band limit and one-third the quantity of the lower low-to-high band limit subtracted from the upper low-to-high band limit and the computed high-to-low trial value is equal to the sum of the lower high-to-low band limit and two-thirds the quantity of the lower high-to-low band limit subtracted from the upper high-to-low band limit.

8. A computer readable memory device having stored thereon computer program instructions executable by the computer to perform a method for testing an electronic component, the instructions comprising:
specifying search range limits, low-to-high transition edge and high-to-low transition edge found criterion, and number of comparison outcomes in a trial comprising multiple tests specified as proof of a low-to-high transition edge or as proof of a high-to-low transition edge;

computing initial values for trial parameters using the search range limits, wherein the trial parameters comprise: low-to-high band limits for a low-to-high trial and a low-to-high trial value, high-to-low band limits for a high-to-low trial and a high-to-low trial value, and number of high indicating comparison outcomes from an assumed previous trial;

specifying the low-to-high transition edge and the high-to-low transition edge as not found;

if low-to-high transition edge not found:
  executing the low-to-high trial on the electronic component resulting in various low and high indicating comparison outcomes and
  adjusting part of the trial parameter values based on results of executing the low-to-high trial;

if high-to-low transition edge not found:
  executing the high-to-low trial on the electronic component resulting in various low and high indicating comparison outcomes and
  adjusting another part of the trial parameter values based on results of executing the high-to-low trial;

if the results of the low-to-high trial meet the low-to-high transition edge found criterion:
  specifying the low-to-high transition edge as found;

if the results of the high-to-low trial meet the high-to-low transition edge found criterion:
  specifying the high-to-low transition edge as found;

if either low-to-high or high-to-low transition edge not found:
  adjusting still another part of the trial parameter values based on results of the above executed trials and
  repeating the above beginning with the condition if low-to-high transition edge not found; and
storing the final trial parameter values.

9. The computer readable memory device as recited in claim 8, the instructions further comprising:
prior to executing the low-to-high trial, ensuring that the electronic component is in its low state; and
prior to executing the high-to-low trial, ensuring that the electronic component is in its high state.

10. The computer readable memory device as recited in claim 8, wherein the low-to-high transition edge found criterion and the high-to-low transition edge found criterion depend upon a value specified for a resolution limit of the search.

11. The computer readable memory device as recited in claim 10, the instructions further comprising:
if the absolute difference between upper and lower low-to-high band limits for the low-to-high trial is less than the resolution limit of the search, marking the low-to-high transition edge as found; and
if the absolute difference between upper and lower high-to-low band limits for the high-to-low trial is less than the resolution limit of the search, marking the high-to-low transition edge as found.

12. The computer readable memory device as recited in claim 8, the instructions further comprising:
computing the low-to-high trial value based on the upper and lower low-to-high band limits; and
computing the high-to-low trial value based on the upper and lower high-to-low band limits.

13. The computer readable memory device as recited in claim 12, wherein if either the upper low-to-high band limit does not equal the upper high-to-low band limit or if the lower low-to-high band limit does not equal the lower high-to-low band limit, the computed low-to-high trial value is equal to one-half the sum of the upper low-to-high band limit and the lower low-to-high band limit and the computed high-to-low trial value is equal to one-half the value of the upper high-to-low band limit subtracted from the lower high-to-low band limit.

14. The computer readable memory device as recited in claim 12, wherein if the upper low-to-high band limit equals the upper high-to-low band limit and if the lower low-to-high band limit equals the lower high-to-low band limit, the computed low-to-high trial value is equal to the sum of the lower low-to-high band limit and one-third the quantity of the lower low-to-high band limit subtracted from the upper low-to-high band limit and the computed high-to-low trial value is equal to the sum of the lower high-to-low band limit and two-thirds the quantity of the lower high-to-low band limit subtracted from the upper high-to-low band limit.

15. A method for testing an electronic component, comprising:
specifying search range limits and low-to-high transition edge and high-to-low transition edge found criterion;
computing initial values for trial parameters using the search range limits, wherein the trial parameters comprise: low-to-high band limits for a low-to-high trial and a low-to-high trial value and high-to-low band limits for a high-to-low trial and a high-to-low trial value;
specifying the low-to-high transition edge and the high-to-low transition edge as not found;
if low-to-high transition edge not found:
  ensuring that the electronic component is in its low state,
  executing the low-to-high trial on the electronic component resulting in various low and high indicating comparison outcomes, and
  adjusting part of the trial parameter values based on results of executing the low-to-high trial;
if high-to-low transition edge not found:
  ensuring that the electronic component is in its high state,
  executing the high-to-low trial on the electronic component resulting in various low and high indicating comparison outcomes, and
  adjusting another part of the trial parameter values based on results of executing the high-to-low trial;
if the results of the low-to-high trial meet the low-to-high transition edge found criterion:
  specifying the low-to-high transition edge as found;
if the results of the high-to-low trial meet the high-to-low transition edge found criterion:
  specifying the high-to-low transition edge as found;
if either low-to-high or high-to-low transition edge not found:
  adjusting still another part of the trial parameter values based on results of the above executed trials and
  repeating the above beginning with the condition if low-to-high transition edge not found; and
storing the final trial parameter values.

16. The method as recited in claim 15, wherein the low-to-high transition edge found criterion and the high-to-low transition edge found criterion depend upon a value specified for a resolution limit of the search.

17. The method as recited in claim 16, further comprising:
if the absolute difference between upper and lower low-to-high band limits for the low-to-high trial is less than the resolution limit of the search, marking the low-to-high transition edge as found; and if the absolute difference between upper and lower high-to-low band limits for the high-to-low trial is less than the resolution limit of the search, marking the high-to-low transition edge as found.

18. The method as recited in claim 15, further comprising:
computing the low-to-high trial value based on the upper and lower low-to-high band limits; and
computing the high-to-low trial value based on the upper and lower high-to-low band limits.

19. A computer readable memory device having stored thereon computer program instructions executable by the computer to perform a method for testing an electronic component, the instructions comprising:
specifying search range limits and low-to-high transition edge and high-to-low transition edge found criterion;
computing initial values for trial parameters using the search range limits, wherein the trial parameters comprise: low-to-high band limits for a low-to-high trial and a low-to-high trial value and high-to-low band limits for a high-to-low trial and a high-to-low trial value;
specifying the low-to-high transition edge and the high-to-low transition edge as not found;
if low-to-high transition edge not found:
ensuring that the electronic component is in its low state,
executing the low-to-high trial on the electronic component resulting in various low and high indicating comparison outcomes, and
adjusting part of the trial parameter values based on results of executing the low-to-high trial;
if high-to-low transition edge not found:
ensuring that the electronic component is in its high state,
executing the high-to-low trial on the electronic component resulting in various low and high indicating comparison outcomes, and
adjusting another part of the trial parameter values based on results of executing the high-to-low trial;
if the results of the low-to-high trial meet the low-to-high transition edge found criterion:
specifying the low-to-high transition edge as found;
if the results of the high-to-low trial meet the high-to-low transition edge found criterion:
specifying the high-to-low transition edge as found;
if either low-to-high or high-to-low transition edge not found:
adjusting still another part of the trial parameter values based on results of the above executed trials and
repeating the above beginning with the condition if low-to-high transition edge not found; and
storing the final trial parameter values.

20. The computer readable memory device as recited in claim 19, wherein the low-to-high transition edge found criterion and the high-to-low transition edge found criterion depend upon a value specified for a resolution limit of the search.

21. The computer readable memory device as recited in claim 20, the instructions further comprising:
if the absolute difference between upper and lower low-to-high band limits for the low-to-high trial is less than the resolution limit of the search, marking the low-to-high transition edge as found; and
if the absolute difference between upper and lower high-to-low band limits for the high-to-low trial is less than the resolution limit of the search, marking the high-to-low transition edge as found.

22. The computer readable memory device as recited in claim 19, the instructions further comprising:
computing the low-to-high trial value based on the upper and lower low-to-high band limits; and
computing the high-to-low trial value based on the upper and lower high-to-low band limits.

* * * * *